US012790217B2

(12) United States Patent
Kim

(10) Patent No.: US 12,790,217 B2
(45) Date of Patent: Nov. 10, 2026

(54) FLEXIBLE GRAPHITE STRUCTURE

(71) Applicant: NEOGRAF SOLUTIONS, LLC, Lakewood, OH (US)

(72) Inventor: Ki Ho Kim, Namyangju-si (KR)

(73) Assignee: NEOGRAF SOLUTIONS, LLC, Lakewood, OH (US)

( * ) Notice: Subject to any disclaimer, the term of this patent is extended or adjusted under 35 U.S.C. 154(b) by 848 days.

(21) Appl. No.: 17/859,149

(22) Filed: Jul. 7, 2022

(65) Prior Publication Data

US 2023/0019938 A1 Jan. 19, 2023

(30) Foreign Application Priority Data

Jul. 9, 2021 (KR) ........................ 10-2021-0090382

(51) Int. Cl.
*C01B 32/20* (2017.01)
*B32B 3/26* (2006.01)
(Continued)

(52) U.S. Cl.
CPC .............. *C01B 32/20* (2017.08); *B32B 3/266* (2013.01); *B32B 9/007* (2013.01); *B32B 9/04* (2013.01);
(Continued)

(58) Field of Classification Search
CPC . Y10T 428/24777; Y10T 428/30; B32B 3/00; B32B 3/02; B32B 3/26; B32B 9/00;
(Continued)

(56) References Cited

U.S. PATENT DOCUMENTS 6,673,284 B2 1/2004 Mercuri et al.
9,807,878 B2 10/2017 Tatami et al.
(Continued)

FOREIGN PATENT DOCUMENTS

JP 2010064434 A 3/2010
JP 2021501464 A 1/2021
(Continued)

OTHER PUBLICATIONS

International Search Report from PCT Application No. PCT/KR2022/009844 dated Oct. 14, 2022 (4 pages).
(Continued)

*Primary Examiner* — Maria V Ewald
*Assistant Examiner* — Ethan A. Utt
(74) *Attorney, Agent, or Firm* — Calfee, Halter & Griswold LLP

(57) ABSTRACT

Disclosed is a flexible graphite structure that can be used as a heat dissipation sheet of a flexible electronic device through a graphite sheet unit including a stretchable area formed as a cut area or an overlapping area. A disclosed flexible graphite structure includes: a graphite sheet unit comprising a single graphite sheet layer or multiple graphite sheet layers having at least one stretchable area; and a stretchable sheet layer configured to be attached to at least one of both outermost sides of the graphite sheet unit and to cover the at least one stretchable area, wherein the at least one stretchable area is formed by providing at least one pair of cutout areas in the single graphite sheet layer or by providing an overlapping area where the single graphite sheet layer or the multiple graphite sheet layers overlap.

23 Claims, 15 Drawing Sheets

(51) Int. Cl.

| | |
|---|---|
| ***B32B 9/00*** | (2006.01) |
| ***B32B 9/04*** | (2006.01) |
| ***H05K 7/20*** | (2006.01) |
| *H10W 40/25* | (2026.01) |

(52) U.S. Cl.
CPC ......... *H05K 7/20481* (2013.01); *H10W 40/25* (2026.01)

(58) Field of Classification Search
CPC ........... B32B 9/005; B32B 9/007; B32B 9/04; B32B 9/043; B32B 9/045; B32B 2307/302; B32B 2307/51; B32B 2313/04; B32B 2457/00; H05K 7/20; H05K 7/2039; H05K 7/20436; H05K 7/20445; H05K 7/20472; H05K 7/20481; H01L 23/34; H01L 23/36; H01L 23/373; H01L 23/3733; H01L 23/3737; H01L 23/3735; C01B 32/20; C01B 32/21
USPC .................................................. 428/192, 408
See application file for complete search history.

(56) References Cited

U.S. PATENT DOCUMENTS

| | | | | |
|---|---|---|---|---|
| 2010/0196716 | A1* | 8/2010 | Ohta | B32B 9/045 428/408 |
| 2017/0323780 | A1* | 11/2017 | Koga | B32B 15/20 |
| 2020/0024144 | A1* | 1/2020 | Murakami | C09J 201/00 |
| 2020/0245501 | A1* | 7/2020 | Wu | F28F 3/02 |

FOREIGN PATENT DOCUMENTS

| | | | | |
|---|---|---|---|---|
| KR | 20110036775 | A | 4/2011 | |
| KR | 10-2011-0083546 | A | 7/2011 | |
| KR | 20160148487 | A | 12/2016 | |
| KR | 20200070336 | A | 6/2020 | |
| WO | 2008143120 | A1 | 11/2008 | |
| WO | 2018-159374 | A1 | 9/2018 | |
| WO | WO-2019076081 | A1 * | 4/2019 | F28F 3/02 |
| WO | 2019142082 | A1 | 7/2019 | |

OTHER PUBLICATIONS

European Search Report from European Application No. 22838011.9 dated Apr. 4, 2025, 9 pages.

Office Action from Korean Application No. 10-2021-0090382 dated Jun. 11, 2025, 25 pages.

Office Action from Japanese Application No. 2024-500194 dated Jan. 27, 2026.

* cited by examiner

FLEXIBLE GRAPHITE STRUCTURE

CROSS-REFERENCE TO RELATED APPLICATION

This application is based upon and claims the benefit of priority from Korean Patent Application No. 10-2021-0090382, filed on Jul. 9, 2021, the entire contents of which are incorporated herein by reference.

TECHNICAL FIELD

The present disclosure is a flexible graphite structure formed by using a graphite sheet unit including a stretchable area by a cutout area or an overlapping area as a heat dissipation layer, and bonding a stretchable sheet layer to at least one outermost surface of the graphite sheet unit for protecting the graphite sheet unit.

BACKGROUND

As portable/mobile devices, such as cameras, mobile phones, mobile computers, and tablets, have evolved over several decades, the needs and capabilities of these devices have also evolved. In each generation of devices, devices have been enabling users to create, modify, and deliver content from their devices, as well as being able to provide more content to their users in a more user-friendly format at ever higher bandwidth than ever before. As the convenience of these devices has been improved, the power requirements for the devices have increased, and the technology associated with the batteries of these devices has been improved. Today's generation of devices contain more energy, generate more power, and as a result generate more heat. In addition to batteries, the hardware items of devices (e.g., radio units, displays, and processing units) have also become more robust, which have likewise created additional thermal issues for these devices.

In order to solve such a thermal problem, a technique for attaching a graphite sheet layer having high thermal conductivity to a heat generating portion of an electronic device has been devised. When a graphite sheet layer is attached to the rear surface of a portion where a lot of heat is generated in an electronic device, the thermal conductivity in the plane direction of the graphite sheet layer is relatively large compared to the thermal conductivity in the thickness direction of the graphite sheet layer. Thus, heat diffuses and moves efficiently, and through this, heat generated in the electronic device is radiated to the outside through the graphite sheet layer.

In recent years, as the technology of portable/mobile devices has been further developed, devices equipped with various displays, such as a flexible display which is bendable, and a foldable display which folds and unfolds, have been developed. In order to dissipate heat from such a device, flexibility of a heat dissipation sheet itself is required. However, the use of a graphite sheet, which is excellent in horizontal heat transfer characteristic, in flexible electronic devices has been limited due to its low flexibility.

SUMMARY

The present disclosure is to solve a problem in that it is difficult to use a graphite sheet as a heat dissipation sheet in a flexible electronic device due to the low flexibility of the graphite sheet, and provides a flexible graphite structure that can be used as a heat dissipation sheet of a flexible electronic device via a graphite sheet unit including a stretchable area including a cutout area or an overlapping area.

A flexible graphite structure according to an embodiment of the present disclosure includes: a graphite sheet unit including a single graphite sheet layer or multiple graphite sheet layers having at least one stretchable area; and a stretchable sheet layer configured to be attached to at least one of both outermost sides of the graphite sheet unit and to cover the at least one stretchable area, wherein the at least one stretchable area is formed by providing at least one pair of cutout areas in the single graphite sheet layer or by providing an overlapping area where the single graphite sheet layer or the multiple graphite sheet layers overlap.

The overlapping area may be formed by providing at least two foldable portions in the single graphite sheet layer such that the overlapping area is provided between the foldable portions or may be formed by overlapping portions of the multiple graphite sheet layers.

The at least one pair of cutout areas may be provided in a point symmetric manner in the single graphite sheet layer, and the single graphite sheet layer may be connected in one sheet in the other areas than the cutout area.

The at least one pair of cutout areas may have a smaller length than the graphite sheet layer in a direction perpendicular to a stretchable direction of the flexible graphite structure.

The length of the at least one pair of cutout areas may be 90% or less or 75% or less of the length of the graphite sheet layer in the direction perpendicular to the stretchable direction of the flexible graphite structure.

The at least one stretchable area may include a void space extending in the direction perpendicular to the stretchable direction of the flexible graphite structure.

The void space may be defined between a graphite sheet layer provided in another area than the overlapping area and a graphite sheet layer provided in the overlapping area, or defined by the at least one pair of cutout areas.

If a force is applied to the flexible graphite structure, the graphite sheet unit may be extended, the stretchable sheet layer may be elongated in a direction where the graphite sheet unit is extended, and the width of the overlapping area may be reduced.

If the force is released, the stretchable sheet layer may be contracted and the width of the overlapping area may be increased.

If a force is applied to the flexible graphite structure, the graphite sheet unit may be extended, the stretchable sheet layer may be elongated in a direction where the graphite sheet unit is extended, and the size of the void space of the at least one pair of cutout areas may be increased.

If the force is released, the stretchable sheet layer may be contracted, and the size of the void space of the at least one pair of cutout areas may be reduced.

The graphite sheet layer may include a graphitized polymer or compressed particles of exfoliated graphite, or a combination thereof.

The stretchable sheet layer may include at least one selected among the group consisting of polydimethylsiloxane (PDMS), an epoxy resin, a styrene-based material, an olefin-based material, polyolefin, polyurethane, thermoplastic polyurethane, a thermoplastic elastomer, polyamides, synthetic rubbers, polybutadiene, polyisobutylene, polychloroprene and silicones.

The stretchable sheet layer may have an elongation of 175% or greater, 200% or greater, or 250% or greater.

The stretchable sheet layer may include a thermally conductive material.

The graphite sheet layer may have a thickness of 15 μm-19 μm, or 16 μm-18 μm.

The graphite sheet unit may include an adhesive layer provided in the graphite sheet layer, wherein the graphite sheet unit may have a uniform thickness.

The adhesive layer may include at least one selected among the group consisting of a pressure sensitive adhesive (PSA), a thermosetting adhesive, a photo curable adhesive, an optical clear adhesive (OCA), an optical clear resin (OCR), a double-sided adhesive film, and a single-sided adhesive film.

When the adhesive layer is formed between the multiple graphite sheet layers spaced from each other, the adhesive layer may be a double-sided adhesive film.

When the adhesive layer is formed between the graphite sheet layer and the stretchable sheet layer, the adhesive layer may be a single-sided adhesive film.

The single-sided adhesive film may be bonded to a surface facing the graphite sheet layer.

The adhesive layer formed between the graphite sheet layer and the stretchable sheet layer may be segmented along the foldable portions of the graphite sheet layer.

The graphite sheet layer may have an in-plane thermal conductivity of 150 W/mK-1700 W/mK.

When the stretchable sheet layer is stretched, the length of the stretchable sheet layer corresponding to the segmented portion of the adhesive layer may be elongated from greater than 0 to 50% or less, or from greater than 0 to 30% or less.

BRIEF DESCRIPTION OF DRAWINGS

The accompanying drawings, which are incorporated in and constitute a part of the specification, illustrate embodiments of the present disclosure.

DETAILED DESCRIPTION

Figure 1A:
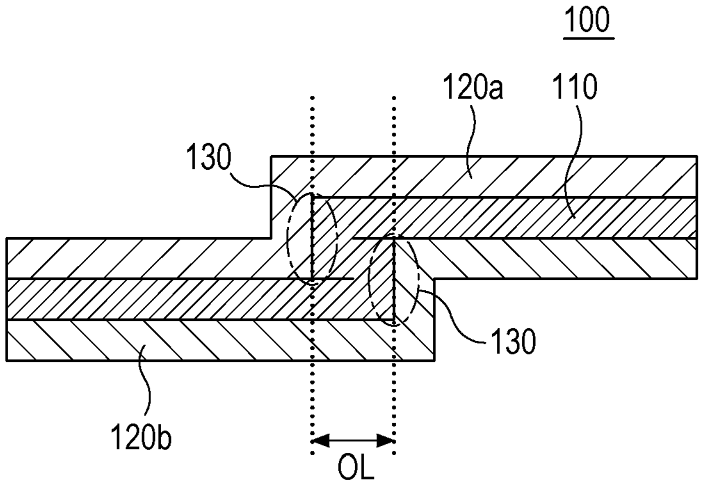
FIGS. 1A, 2A, 3A, 4A, 5A, 6A, 7A, 8A, and 9A are cross-sectional views of flexible graphite structures according to various embodiments in each of which an overlapping area is formed as a stretchable area.

Hereinafter, embodiments of the present disclosure will be described in detail with reference to the accompanying drawings such that a person of ordinarily skill in the art to which the present disclosure belongs can easily carry out the present disclosure. However, the present disclosure may be implemented in many different forms, and is not limited to the embodiments described herein. In order to clearly describe the present disclosure with the drawings, parts irrelevant to the description are omitted, and similar reference numerals are assigned to similar parts throughout the specification.

Throughout the specification, when a part is "connected" with another part, this includes not only the case of being "directly connected" but also the case of being "electrically connected" with another element interposed therebetween. When a certain part includes a certain constituent element, it means that the certain part may include other elements rather than excluding other elements unless specifically stated otherwise.

FIG. 1A is a cross-sectional view of a flexible graphite structure 100 according to an embodiment of the present disclosure in which an overlapping area is formed as a stretchable area.

Referring to FIG. 1A, the flexible graphite structure 100 includes a graphite sheet layer 110 and stretchable sheet layers 120*a* and 120*b* attached to both sides of the graphite sheet layer 110.

The graphite sheet layer 110 includes a graphitized polymer or compressed particles of exfoliated graphite, and is excellent in longitudinal and transverse thermal conductivity on a two-dimensional plane so that it can be used as a heat dissipation sheet for dissipating the heat of a heat generating element to the outside.

The graphite sheet layer 110 has a thickness of about 14 μm-940 μm. The graphite sheet layer 110 may have a thickness of about 14 μm-20 μm, including about 15 μm-19 μm, and about 16 μm-18 μm. When the graphite sheet layer 110 is used in a flexible electronic device having a large internal allowable thickness, the graphite sheet layer 110 may have a thickness of about 20 μm-30 μm, including about 27 μm-37 μm, about 35 μm-45 μm, and about 40 μm-50 μm. In addition, the graphite sheet layer 110 may be have a thickness of 40 μm-940 μm. As the thickness of the graphite sheet layer 110 increases, the heat dissipation performance of the graphite sheet layer may increase. However, the thickness of the graphite sheet layer 110 may be determined depending on the size of the space allowed in the flexible electronic device in which the graphite sheet layer 110 is mounted.

The in-plane thermal conductivity of the graphite sheet layer 110 may be about 150 W/mK-1700 W/mK.

The graphite sheet layer 110 includes at least two foldable portions 130 formed by folding the graphite sheet layer 110, and between the two foldable portions 130, an overlapping area OL is formed by the two foldable portions 130. The overlapping area OL refers to an area where portions of the graphite sheet layer 110 overlap each other when viewed in the vertical direction of FIG. 1A, that is, in the depth direction of the flexible graphite structure 100.

The stretchable sheet layers 120*a* and 120*b* are attached to both sides of the graphite sheet layer 110 in a state in which the overlapping area OL by the two foldable portions 130 are formed on the graphite sheet layer 110. The stretchable sheet layer includes any materials with the elongation described below, and may include, for example, at least one selected among the group consisting of polydimethylsiloxane (PDMS), an epoxy resin, a styrene-based material, an olefin-based material, polyolefin, polyurethane, thermoplastic polyurethane, a thermoplastic elastomer, polyamides, synthetic rubbers, polybutadiene, polyisobutylene, polychloroprene and silicones, but is not limited thereto.

When a force is applied in the longitudinal direction or the width direction, the stretchable sheet layers 120*a* and 120*b* are elongated along a direction where the force is applied, and when the force is released, the stretchable sheet layers 120*a* and 120*b* return to the original lengths thereof. The stretchable sheet layers 120*a* and 120*b* may have an elongation of 175% or more, or 200% or more, or 250% or more, wherein the elongation refers to a ratio of a length of a stretchable sheet layer when a force is applied thereto relative to the original length of the stretchable sheet without the force applied thereto. For example, the original length is 100%, and thus an elongation of 175% would be 75% greater than the original length (100%). In another example, an elongation of 200% would be two times (twice) the length of the original length (100%).

The stretchable sheet layers 120*a* and 120*b* may include a thermally conductive material. The thermally conductive material may be a metallic bead, a polymer bead having a high thermal conductivity, or the like, but is not limited thereto. Since the stretchable sheet layers 120*a* and 120*b* include a thermally conductive material, when the flexible graphite structure 100 is used as a heat dissipation sheet of an electronic device, heat generated in the electronic device can be more efficiently radiated to the outside.

The foldable portions 130 of the graphite sheet layer 110 and the stretchable sheet layers 120*a* and 120*b* are not bonded to each other, and void spaces may be defined. That is, the overlapping area OL may include void spaces, and the void spaces may extend in a direction perpendicular to the stretchable of the flexible graphite structure 100. Due to the existence of the void spaces, when a force is applied to the flexible graphite structure 100, the flexible graphite structure 100 may be extended in the direction of the force.

Figure 1B:
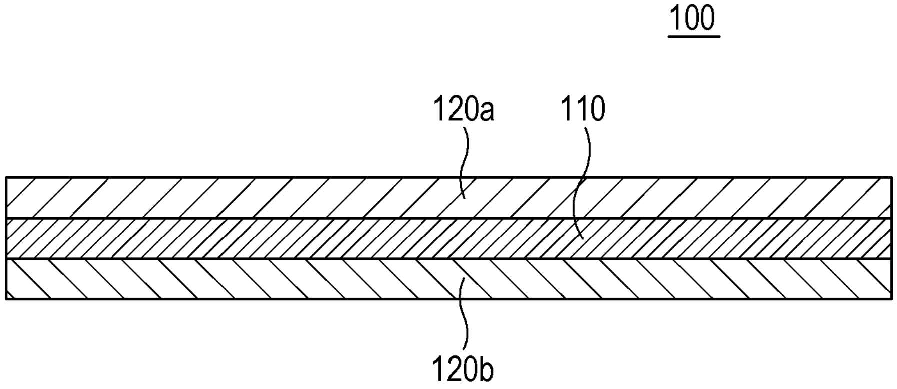
FIGS. 1B, 2B, 3B, 4B, 5B, 6B, 7B, 8B, and 9B are respective cross-sectional views of the flexible graphite structures of FIGS. 1A, 2A, 3A, 4A, 5A, 6A, 7A, 8A, and 9A when the flexible graphite structures are extended in a stretchable direction.

FIG. 1B is a cross-sectional view of the flexible graphite structure 100 when the flexible graphite structure 100 is extended in the stretchable direction.

Referring to FIG. 1B, the flexible graphite structure 100 may be used as a heat dissipation sheet in an electronic device equipped with a flexible display which is bendable or a foldable display which folds and unfolds, and when a user manipulates the electronic device such that the display of the electronic device is bent or folded, a force of pulling the flexible graphite structure 100 to the opposite sides may be applied to the flexible graphite structure 100.

When the force of pulling the flexible graphite structure 100 is applied to the flexible graphite structure 100, the stretchable sheet layers 120*a* and 120*b* are elongated along the direction of the force, and since the graphite sheet layer 110 is integrally bonded to the stretchable sheet layers 120*a* and 120*b*, the graphite sheet layer 110 is also extended to the opposite sides along the direction of the force. Since the graphite sheet layer 110 does not have stretchability, if the graphite sheet layer is a flat graphite sheet, it will not be extended even if a force is applied thereto. However, since the graphite sheet layer 110 of the flexible graphite structure 100 according to the present embodiment has the overlapping area OL formed by two foldable portions 130, the graphite sheet layer 110 can also be extended to the opposite sides along the direction of the force as the foldable portions 130 of the graphite sheet layer 110 are unfolded in response to the application of the force.

As the graphite sheet layer 110 is extended to the opposite sides, the width of the overlapping area OL gradually decreases, and when the graphite sheet layer 110 is maximally extended, the overlapping area OL may disappear.

Since the graphite sheet layer 110 according to the present embodiment has a double-folded shape including two foldable portions 130, the length of the maximally extended flexible graphite structure 100 illustrated in FIG. 1B may be longer than the length of the flexible graphite structure 100 before extension as illustrated in FIG. 1A by twice the length of the overlapping area OL.

When the user returns the electronic device to its original state after the operation of bending or folding the display of the electronic device is performed, the force of pulling the flexible graphite structure 100 is released from the flexible graphite structure 100. When the force of pulling the flexible graphite structure 100 to the opposite sides is released, the stretchable sheet layers 120*a* and 120*b* are contracted back to their original lengths, and accordingly, the width of the overlapping area OL increases while the two foldable portions 130 are also formed in the graphite sheet layer 110. As the contraction of the stretchable sheet layers 120*a* and 120*b* is terminated, the flexible graphite structure 100 returns to its original shape, that is, to the shape illustrated in FIG. 1A.

As the force is applied to and released from the flexible graphite structure 100, the above-described operation is repeatedly performed. Through this operation, heat dissipation of the flexible electronic device can be smoothly performed even when a graphite structure with a high thermal conductivity but low flexibility is used as a heat dissipation sheet.

Figure 2A:
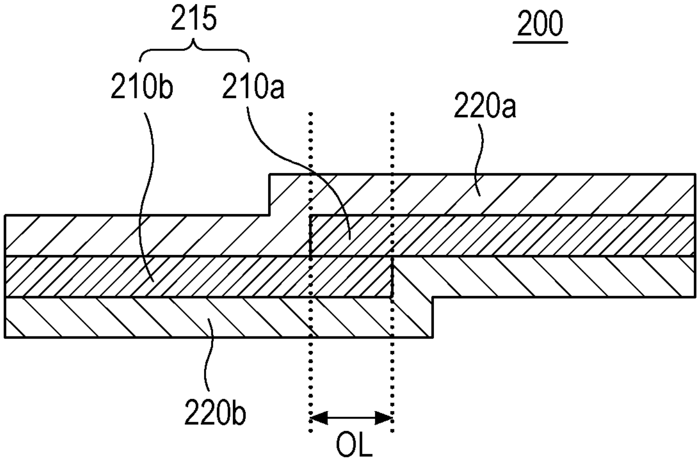

FIG. 2A is a cross-sectional view of a flexible graphite structure 200 according to an embodiment of the present disclosure in which an overlapping area is formed as a stretchable area.

Referring to FIG. 2A, the flexible graphite structure 200 includes a graphite sheet unit 215 including two graphite sheet layers 210*a* and 210*b* and stretchable sheet layers 220*a* and 220*b* attached to both sides of the graphite sheet unit 215.

The graphite sheet layers 210*a* and 210*b* and the stretchable sheet layers 220*a* and 220*b* may be formed of the same materials as the aforementioned graphite sheet layer 110 and the stretchable sheet layers 120*a* and 120*b*, respectively, and overlapping descriptions will be omitted.

The graphite sheet unit 215 includes an overlapping area OL formed by overlapping the two graphite sheet layers 210*a* and 210*b*. The overlapping area OL refers to an area in which the two graphite sheet layers 210*a* and 210*b* overlap each other when viewed in the vertical direction of FIG. 2A, that is, in the depth direction of the flexible graphite structure 200.

The stretchable sheet layers 220*a* and 220*b* are attached to both sides of the graphite sheet unit 215 in a state in which the overlapping area OL formed by overlapping the two graphite sheet layers 210*a* and 210*b* on the graphite sheet unit 215 is formed.

In the area where steps are formed in the graphite sheet unit 215, that is, in the overlapping area OL, the end portions of the graphite sheet layers 210*a* and 210*b* and the stretchable sheet layers 220*a* and 220*b* are not bonded to each other, and void spaces are defined. That is, the overlapping area OL may include void spaces on the opposite sides thereof, and the void spaces may extend in a direction perpendicular to the stretchable direction of the flexible graphite structure 200. Due to the existence of the void spaces, when a force is applied to the flexible graphite structure 200, the flexible graphite structure 200 may be extended in the direction of the force.

Figure 2B:
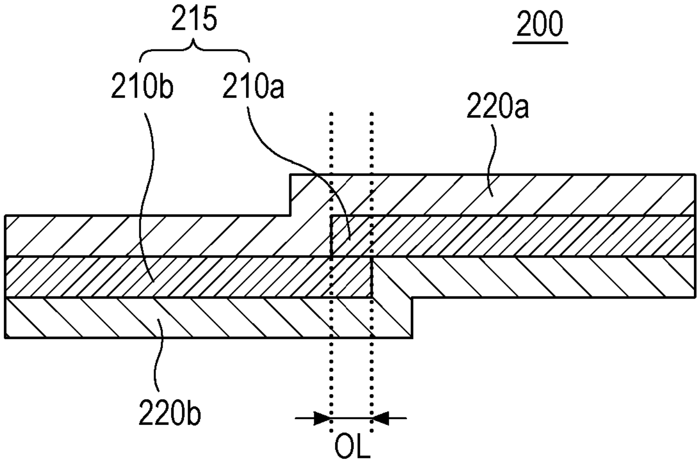

FIG. 2B is a cross-sectional view of the flexible graphite structure 200 when the flexible graphite structure 200 is extended in the stretchable direction.

Referring to FIG. 2B, when a user manipulates the electronic device such that the display of the electronic device is bent or folded, a force of fulling the flexible graphite structure 200 to the opposite sides may be applied to the flexible graphite structure 200.

When the force of fulling the flexible graphite structure 200 to the opposite sides is applied to the flexible graphite structure 200, the stretchable sheet layers 220*a* and 220*b* are extended along the direction of the force, and since the graphite sheet unit 215 is integrally bonded to the stretchable sheet layers 220*a* and 220*b*, the graphite sheet layer 210*a* of the graphite sheet unit 215 moves in one direction, and the graphite sheet layer 210*b* moves in the opposite direction to the one direction. In particular, since the two graphite sheet layers 210*a* and 210*b* are not bonded to each other, but are stacked on each other, the graphite sheet layers can slide and move in the opposite directions by the application of the force. As the two graphite sheet layers 210*a* and 210*b* move in the opposite directions, the graphite sheet unit 215 is also extended to the opposite sides.

As the graphite sheet unit 215 is extended to the opposite sides, the width of the overlapping area OL gradually decreases, and until the overlapping area OL by the two graphite sheet layers 210*a* and 210*b* completely disappears, the flexible graphite structure 200 can be extended.

When the user returns the electronic device to its original state after the operation of bending or folding the display of the electronic device is performed, the force of pulling the flexible graphite structure 200 to the opposite sides is released from the flexible graphite structure 200. When the force of pulling the flexible graphite structure 200 to the opposite sides is released, the stretchable sheet layers 220*a* and 220*b* are contracted back to their original lengths again, and accordingly, the width of the overlapping area OL of the graphite sheet unit 215 increases. As the contraction of the stretchable sheet layers 220*a* and 220*b* is terminated, the flexible graphite structure 200 returns to its original shape, that is, to the shape illustrated in FIG. 2A.

In response to forces that are applied to and released from the flexible graphite structure 200, the above-described operation is repeatedly performed. Through this operation, heat dissipation of the flexible electronic device can be smoothly performed even when a graphite structure with a high thermal conductivity but low flexibility is used as a heat dissipation sheet.

Figure 3A:
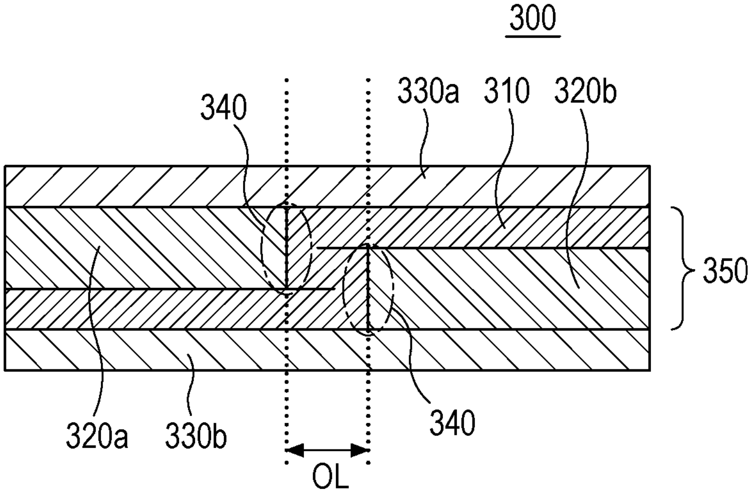

FIG. 3A is a cross-sectional view of a flexible graphite structure 300 according to an embodiment of the present disclosure in which an overlapping area is formed as a stretchable area.

Referring to FIG. 3A, the flexible graphite structure 300 includes: a graphite sheet unit 350 including a graphite sheet layer 310 and adhesive layers 320*a* and 320*b* formed on the graphite sheet layer 310; and stretchable sheet layers 330*a* and 330*b* attached to the outermost both sides of the graphite sheet unit 350.

The graphite sheet layer 310 and the stretchable sheet layers 330*a* and 330*b* may be formed of the same materials as the aforementioned graphite sheet layer and stretchable sheet layers, respectively, and overlapping descriptions will be omitted.

The graphite sheet layer 310 includes at least two foldable portions 340 formed by folding the graphite sheet layer 310, and between the two foldable portions 340, an overlapping area OL is formed by the two foldable portions 340. The overlapping area OL refers to an area where portions of the graphite sheet layer 310 overlap each other when viewed in the vertical direction of FIG. 3A, that is, in the depth direction of the flexible graphite structure 300.

The adhesive layers 320*a* and 320*b* may be formed on the portions where the overlapping area OL is not formed in the graphite sheet layer 310, and it is possible to make the thickness of the graphite sheet unit 350 substantially uniform by using the adhesive layers 320*a* and 320*b*.

The adhesive layers 320*a* and 320*b* may include at least one of a pressure sensitive adhesive (PSA), a thermosetting adhesive, a photo curable adhesive, an optical clear adhesive (OCA), an optical clear resin (OCR), a double-sided adhesive film, and a single-sided adhesive film, but is not limited thereto. The single-sided adhesive film or double-sided adhesive film may include, for example, a base layer (not illustrated) formed of at least one of polyethylene terephthalate (PET), polycarbonate (PC), aluminum foil, copper foil, and polyimide (PI), and an adhesive layer (not illustrated) in which an adhesive is applied to one or both sides of the base layer.

There is no particular limitation on the type or shape of the adhesive layers 320*a* and 320*b*, but when the adhesive layers 320*a* and 320*b* are, for example, in the form of a single-sided adhesive film, the adhesive layers 320*a* and 320*b* may be formed between the graphite sheet layer 310 and the stretchable sheet layers 330*a* and 330*b* by being disposed and bonded such that the adhesion layers of single-sided adhesive films are placed on the surfaces facing the graphite sheet layer 310.

The foldable portions 340 of the graphite sheet layer 310 and the adhesive layers 320*a* and 320*b* are not bonded to each other, and void spaces may be defined. That is, the overlapping area OL may include void spaces on the opposite sides thereof, and the void spaces may extend in a direction perpendicular to the stretchable direction of the flexible graphite structure 300. Due to the existence of the void spaces, when a force is applied to the flexible graphite structure 300, the flexible graphite structure 100 may be extended along the direction of the force.

Figure 3B:
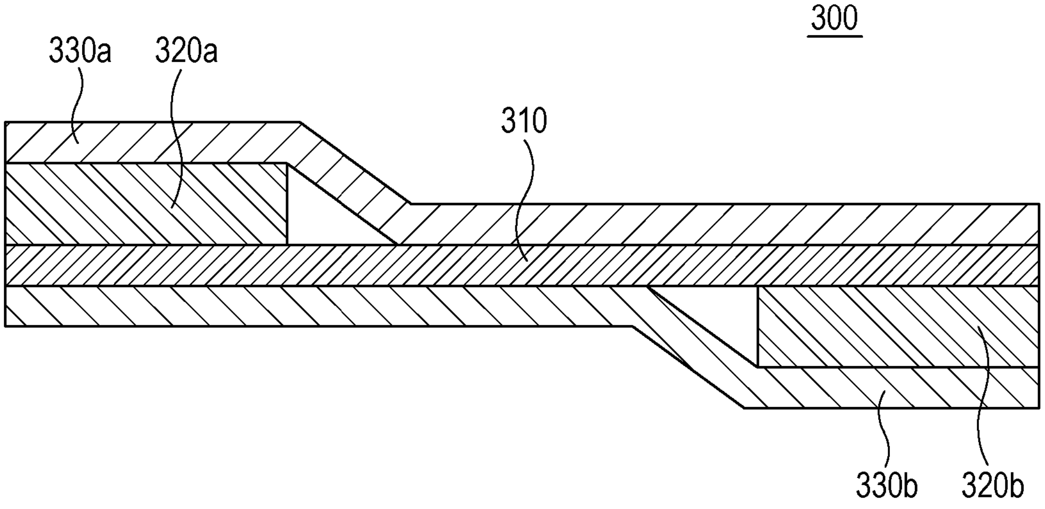

FIG. 3B is a cross-sectional view of the flexible graphite structure 300 when the flexible graphite structure 300 is extended in the stretchable direction.

Referring to FIG. 3B, when a user manipulates the electronic device such that the display of the electronic device is bent or folded, a force of pulling the flexible graphite structure 300 to either side may be applied to the flexible graphite structure 300.

When the force of pulling the flexible graphite structure 300 to the opposite sides is applied to the flexible graphite structure 300, the stretchable sheet layers 330*a* and 330*b* are stretched along the direction of the force, and since the graphite sheet unit 350 is integrally bonded to the stretchable sheet layers 330*a* and 330*b* and the graphite sheet layer 310 of the flexible graphite structure 300 includes the overlapping area OL formed by two foldable portions 340, the foldable portions 340 of the graphite sheet layer 310 are unfolded in response to the application of the force, and the graphite sheet layer 310 can also be extended to either side along the direction of the force. In addition, since both sides of the adhesive layer 320*a* are fixedly bonded to the graphite sheet layer 310 and the stretchable sheet layer 330*a*, and the both sides of the adhesive layer 320*b* are fixedly bonded to the graphite sheet layer 310 and the stretchable sheet layer 330*b*, the adhesive layers 320*a* and 320*b* move away from each other in response to the extension of the stretchable sheet layers 330*a* and 330*b* and the graphite sheet layer 310.

As the graphite sheet unit 350 is extended to either side, the width of the overlapping area OL gradually decreases, and when the graphite sheet part 350 is maximally extended, the overlapping area OL may disappear.

When the user returns the electronic device to its original state after the operation of bending or folding the display of the electronic device is performed, the force of pulling the flexible graphite structure 300 to either side is released from the flexible graphite structure 300. When the force of pulling the flexible graphite structure 300 to either side is released, the stretchable sheet layers 330*a* and 330*b* are contracted back to their original lengths again, and accordingly, the width of the overlapping area OL of the graphite sheet part 350 increases. As the contraction of the stretchable sheet layers 330*a* and 330*b* is terminated, the flexible graphite structure 300 returns to its original shape, that is, to the shape illustrated in FIG. 3A.

In response to forces that are applied to and released from the flexible graphite structure 300, the above-described operation is repeatedly performed. Through this operation, heat dissipation of the flexible electronic device can be smoothly performed even when a graphite structure with a high thermal conductivity but low flexibility is used as a heat dissipation sheet. In the flexible graphite structure 300 according to the present embodiment, since it is possible to make the thickness of the graphite sheet unit 350 substantially uniform in the state before extension by using the adhesive layers 320*a* and 320*b*, it is possible to attach the graphite structure to a flexible electronic device more easily.

Figure 4A:
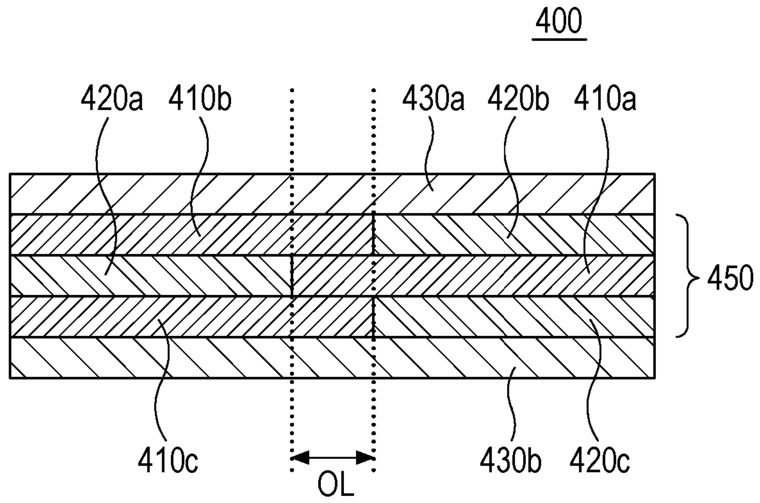

FIG. 4A is a cross-sectional view of a flexible graphite structure 400 according to an embodiment of the present disclosure in which an overlapping area is formed as a stretchable area.

Referring to FIG. 4A, the flexible graphite structure 400 includes: a graphite sheet unit 450 including three graphite sheet layers 410*a*, 410*b*, and 410*c* and adhesive layers 420*a*, 420*b*, and 420*c* formed on the graphite sheet layer 410*a*, 410*b*, and 410*c*; and stretchable sheet layers 430*a* and 430*b* attached to the outermost both sides of the graphite sheet unit 450.

The three graphite sheet layers 410*a*, 410*b*, and 410*c*, the adhesive layers 420*a*, 420*b*, and 420*c*, and the stretchable sheet layers 430*a* and 430*b* may be formed of the same materials as the aforementioned graphite sheet layers, adhesive layers, and stretchable sheet layers, respectively, and overlapping descriptions will be omitted.

The graphite sheet unit 450 includes an overlapping area OL formed by overlapping the three graphite sheet layers 410*a*, 410*b*, and 410*c*. The overlapping area OL refers to an area in which the three graphite sheet layers 410*a*, 410*b*, and 410*c* overlap each other when viewed in the vertical direction of FIG. 4A, that is, in the depth direction of the flexible graphite structure 400.

The adhesive layers 420*a*, 420*b*, and 420*c* may be formed on portions where the overlapping area OL is not formed in the three graphite sheet layers 410*a*, 410*b*, and 410*c*, wherein the adhesive layer 420*a* may be formed between two graphite sheet layers 410*b* and 410*c*, and the adhesive layers 420*b* and 420*c* may be formed between the graphite sheet layer 410*a* and the stretchable sheet layers 430*a* and 430*b*. It is possible to make the thickness of the graphite sheet unit 450 substantially uniform by using the adhesive layers 420*a*, 420*b*, and 420*c*.

There is no particular limitation on the type or shape of the adhesive layer 420*a* formed between the two graphite sheet layers 410*b* and 410*c* that are spaced apart from each other. However, when the adhesive layer 420*a* is, for example, in the form of an adhesive film, the adhesive layer is preferably a double-sided adhesive film since adhesion layers are required on the both sides thereof that face the graphite sheet layers 410*b* and 410*c* in order to be bonded to the graphite sheet layers 410*b* and 410*c*.

When the adhesive layers 420*b* and 420*c* formed between the graphite sheet layer 410*a* and the stretchable sheet layers 430*a* and 430*b* are, for example, in the form of an adhesive film, each of the adhesive layers may not only be a double-sided adhesive film, but also a single-sided adhesive film since it is sufficient if an adhesion layer can be disposed on a surface that faces the graphite sheet layer 410*a*.

In the overlapping area OL, the end portions of the three graphite sheet layers 410*a*, 410*b*, and 410*c* and the adhesive layers 420*a*, 420*b*, and 420*c* are not bonded to each other, and void spaces may be defined. That is, the overlapping area OL may include void spaces on the opposite sides thereof, and the void spaces may extend in a direction perpendicular to the stretchable direction of the flexible graphite structure 400. Due to the existence of the void spaces, when a force is applied to the flexible graphite structure 400, the flexible graphite structure 100 may be extended along the direction of the force.

Figure 4B:
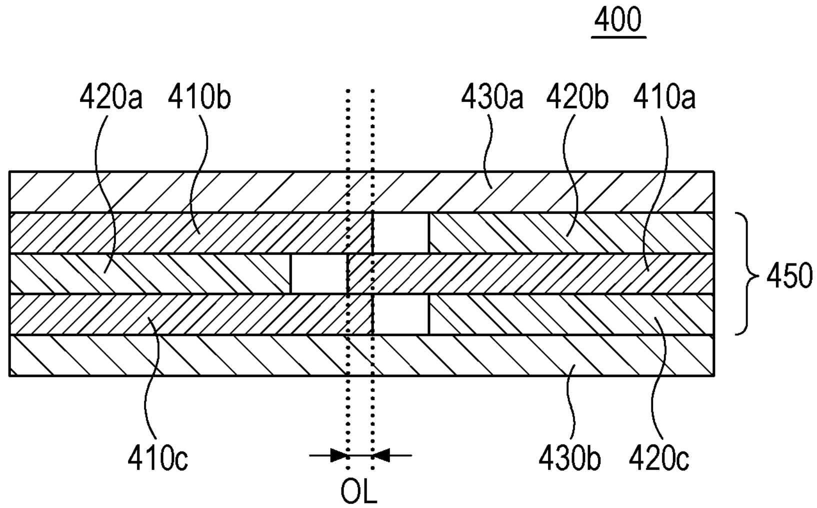

FIG. 4B is a cross-sectional view of the flexible graphite structure 400 when the flexible graphite structure 400 is extended in the stretchable direction.

Referring to FIG. 4B, when a user manipulates the electronic device such that the display of the electronic device is bent or folded, a force of pulling the flexible graphite structure 400 to either side may be applied to the flexible graphite structure 400.

When the force of pulling the flexible graphite structure 400 to either side is applied, the stretchable sheet layers 430*a* and 430*b* are extended along the direction of the force, and since the graphite sheet unit 450 is integrally bonded to the stretchable sheet layers 430*a* and 430*b*, the graphite sheet layer 410*a* of the graphite sheet unit 450 moves in one direction, and the graphite sheet layers 410*b* and 410*c* move in the opposite direction to the one direction. In particular, since the three graphite sheet layers 410*a*, 410*b*, and 410*c* are not bonded to each other, but are stacked on each other, the graphite sheet layers can slide and move in the opposite directions by the application of the forces. Since the graphite sheet layer 410*a* and the two graphite sheet layers 410*b* and 410*c* move in the opposite directions, the graphite sheet unit 450 is also extended to either side.

As the graphite sheet unit 450 is extended to either side, the width of the overlapping area OL gradually decreases, and until the overlapping area OL by the three graphite sheet layers 410*a*, 410*b*, and 410*c* completely disappears, the flexible graphite structure 400 can be extended.

When the user returns the electronic device to its original state after the operation of bending or folding the display of the electronic device is performed, the force of pulling the flexible graphite structure 400 to either side is released from the flexible graphite structure 400. When the force of pulling the flexible graphite structure 400 to either side is released, the stretchable sheet layers 430*a* and 430*b* are contracted back to their original lengths again, and accordingly, the width of the overlapping area OL of the graphite sheet part 450 increases. As the contraction of the stretchable sheet layers 430*a* and 430*b* is terminated, the flexible graphite structure 400 returns to its original shape, that is, to the shape illustrated in FIG. 4A.

In response to forces that are applied to and released from the flexible graphite structure 400, the above-described operation is repeatedly performed. Through this operation, heat dissipation of the flexible electronic device can be smoothly performed even when a graphite structure with a high thermal conductivity but low flexibility is used as a heat dissipation sheet. In the flexible graphite structure 400 according to the present embodiment, since it is possible to make the thickness of the graphite sheet unit 450 substantially uniform in the state before extension by using the adhesive layers 420*a*, 420*b*, and 420*c*, it is possible to attach the graphite structure to a flexible electronic device more easily.

Figure 5A:
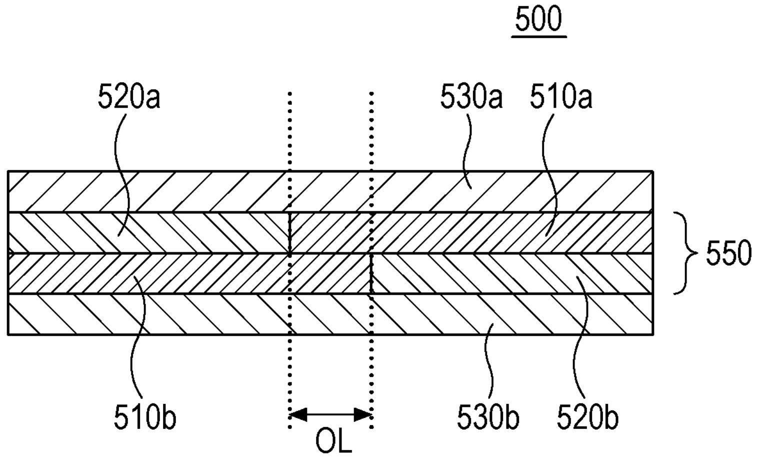

FIG. 5A is a cross-sectional view of a flexible graphite structure 500 according to an embodiment of the present disclosure in which an overlapping area is formed as a stretchable area.

Referring to FIG. 5A, the flexible graphite structure 500 includes: a graphite sheet unit 550 including two graphite sheet layers 510*a* and 510*b* and adhesive layers 520*a* and 520*b* formed on the graphite sheet layer 510*a* and 510*b*; and stretchable sheet layers 530*a* and 530*b* attached to the outermost both sides of the graphite sheet unit 550.

The two graphite sheet layers 510*a* and 510*b*, the adhesive layers 520*a* and 520*b*, and the stretchable sheet layers 530*a* and 530*b* may be formed of the same materials as the aforementioned graphite sheet layers, adhesive layers, and stretchable sheet layers, respectively, and overlapping descriptions will be omitted.

The graphite sheet unit 550 includes an overlapping area OL formed by overlapping the two graphite sheet layers 510*a* and 510*b*. The overlapping area OL refers to an area in which the two graphite sheet layers 510*a* and 510*b* overlap each other when viewed in the vertical direction of FIG. 5A, that is, in the depth direction of the flexible graphite structure 500.

The adhesive layers 520*a* and 520*b* may be formed on the portions where the overlapping area OL is not formed in the graphite sheet layers 510*a* and 510*b*, and it is possible to make the thickness of the graphite sheet unit 550 substantially uniform by using the adhesive layers 520*a* and 520*b*.

There is no particular limitation on the type or shape of the adhesive layers 520*a* and 520*b*, but when the adhesive layers 520*a* and 520*b* are, for example, in the form of a single-sided adhesive film, the adhesive layers 520*a* and 520*b* may be formed between the graphite sheet layers 510*a* and 510*b* and the stretchable sheet layers 530*a* and 530*b* by being disposed and bonded such that the adhesion layers of single-sided adhesive films are placed on the surfaces facing the graphite sheet layers 510*a* and 510*b*.

In the overlapping area OL, the end portions of the two graphite sheet layers 510*a* and 510*b* and the adhesive layers 520*a* and 520*b* are not bonded to each other, and void spaces may be defined. That is, the overlapping area OL may include void spaces on the opposite sides thereof, and the void spaces may extend in a direction perpendicular to the stretchable direction of the flexible graphite structure 500. Due to the existence of the void spaces, when a force is applied to the flexible graphite structure 500, the flexible graphite structure 500 may be extended along the direction of the force.

Figure 5B:
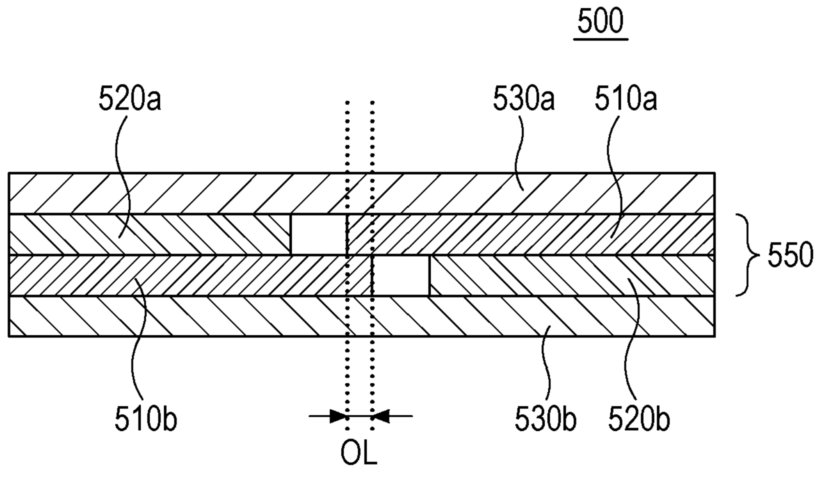

FIG. 5B is a cross-sectional view of the flexible graphite structure 500 when the flexible graphite structure 500 is extended in the stretchable direction.

Referring to FIG. 5B, when a user manipulates the electronic device such that the display of the electronic device is bent or folded, a force of pulling the flexible graphite structure 500 to either side may be applied to the flexible graphite structure 500.

When the force of pulling the flexible graphite structure 500 to either side is applied to the flexible graphite structure 500, the stretchable sheet layers 530*a* and 530*b* are extended along the directions of the forces, and since the graphite sheet unit 550 is integrally bonded to the stretchable sheet layers 530*a* and 530*b*, the graphite sheet layer 510*a* of the graphite sheet unit 550 moves in one direction, and the graphite sheet layer 510*b* moves in the opposite direction to the one direction. In addition, since the both sides of the adhesive layer 520*a* are fixedly bonded to the graphite sheet layer 510*b* and the stretchable sheet layer 530*a*, and the both sides of the adhesive layer 520*b* are fixedly bonded to the graphite sheet layers 510*a* and the stretchable sheet layer 530*b*, the adhesive layers 520*a* and 520*b* move away from each other in response to the extension of the stretchable sheet layers 530*a* and 530*b* and the graphite sheet layers 510*a* and 510*b*. In particular, since the two graphite sheet layers 510*a* and 510*b* are not bonded to each other, but are stacked on each other, the graphite sheet layers can slide and move in the opposite directions by the application of the forces. As the two graphite sheet layers 510*a* and 510*b* move in the opposite directions, the graphite sheet unit 550 is also extended in the opposite directions.

As the graphite sheet unit 550 is extended to either side, the width of the overlapping area OL gradually decreases, and until the overlapping area OL by the two graphite sheet layers 510*a* and 510*b* completely disappears, the flexible graphite structure 500 can be extended.

When the user returns the electronic device to its original state after the operation of bending or folding the display of the electronic device is performed, the force of pulling the flexible graphite structure 500 to either side is released from the flexible graphite structure 500. When the force of pulling the flexible graphite structure 500 to either side is released, the stretchable sheet layers 530*a* and 530*b* are contracted back to their original lengths again, and accordingly, the width of the overlapping area OL of the graphite sheet unit 550 increases. As the contraction of the stretchable sheet layers 530*a* and 530*b* is terminated, the flexible graphite structure 500 returns to its original shape, that is, to the shape illustrated in FIG. 5A.

As the forces are applied to and released from the flexible graphite structure 500, the above-described operation is repeatedly performed. Through this operation, heat dissipation of the flexible electronic device can be smoothly performed even when a graphite structure with a high thermal conductivity but low flexibility is used as a heat dissipation sheet. In the flexible graphite structure 500 according to the present embodiment, since it is possible to make the thickness of the graphite sheet unit 550 substantially uniform in the state before extension by using the adhesive layers 520*a* and 520*b*, it is possible to attach the graphite structure to a flexible electronic device more easily.

Figure 6A:
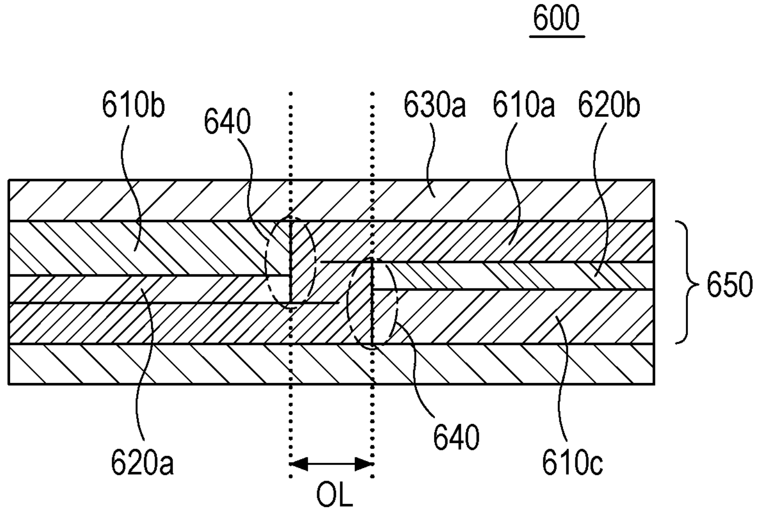

FIG. 6A is a cross-sectional view of a flexible graphite structure 600 according to an embodiment of the present disclosure in which an overlapping area is formed as a stretchable area.

Referring to FIG. 6A, the flexible graphite structure 600 includes: a graphite sheet unit 650 including three graphite sheet layers 610*a*, 610*b*, and 610*c* and adhesive layers 620*a* and 620*b* formed on the graphite sheet layer 610*a*, 610*b*, and 610*c*; and stretchable sheet layers 630*a* and 630*b* attached to the outermost both sides of the graphite sheet unit 650.

The graphite sheet layers 610*a*, 610*b*, and 610*c*, the adhesive layers 620*a* and 620*b*, and the stretchable sheet layers 630*a* and 630*b* may be formed of the same materials as the aforementioned graphite sheet layers, adhesive layers, and stretchable sheet layers, respectively, and overlapping descriptions will be omitted.

The graphite sheet layer 610*a* includes at least two foldable portions 640 formed by folding the graphite sheet layer 610*a*, and between the two foldable portions 640, an overlapping area OL is formed by the two foldable portions 640. The overlapping area OL refers to an area where portions of the graphite sheet layer 610*a* overlap each other when viewed in the vertical direction of FIG. 6A, that is, in the depth direction of the flexible graphite structure 600.

The adhesive layers 620*a* and 620*b* may be formed on portions where the overlapping area OL is not formed in the graphite sheet layers 610*a*, 610*b*, and 610*c*, wherein the adhesive layer 620*a* may be formed between the graphite sheet layer 610*a* and the graphite sheet layer 610*b*, and the adhesive layer 620*b* may be formed between the graphite sheet layer 610*a* and the graphite sheet layer 610*c*. It is possible to make the thickness of the graphite sheet unit 650 substantially uniform by using the adhesive layers 620*a* and 620*b* and the graphite sheet layers 610*b* and 610*c*.

There is no particular limitation on the type or shape of the adhesive layers 620*a* and 620*b* formed between the graphite sheet layers 610*a*, 610*b*, and 610*c* that are spaced apart from each other. However, when the adhesive layers 620*a* and 620*b* are, for example, in the form of an adhesive film, the adhesive layers are preferably double-sided adhesive films since adhesion layers are required on the both sides thereof that face the graphite sheet layers 610*a*, 610*b*, and 610*c* in order to be bonded to the graphite sheet layers 610*a*, 610*b*, and 610*c*.

The foldable portions 640 of the graphite sheet layer 610*a*, the adhesive layers 620*a* and 620*b*, and the graphite sheet layers 610*b* and 610*c* are not bonded to each other, and void spaces may be defined. That is, the overlapping area OL may include void spaces on the opposite sides thereof, and the void spaces may extend in a direction perpendicular to the stretchable direction of the flexible graphite structure 600. Due to the existence of the void spaces, when a force is applied to the flexible graphite structure 600, the flexible graphite structure 600 may be extended along the direction of the force.

Figure 6B:
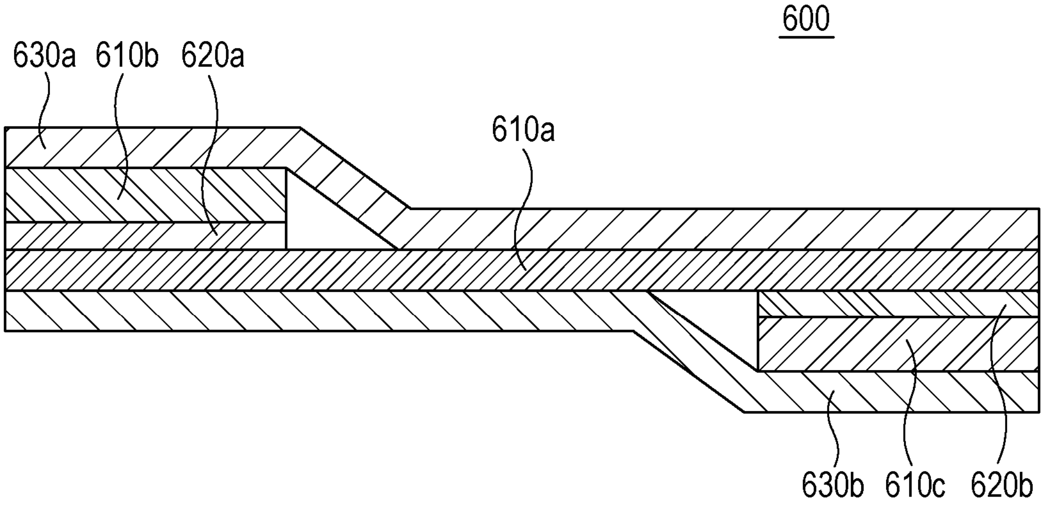

FIG. 6B is a cross-sectional view of the flexible graphite structure 600 when the flexible graphite structure 600 is extended in the stretchable direction.

Referring to FIG. 6B, when a user manipulates the electronic device such that the display of the electronic device is bent or folded, a force of pulling the flexible graphite structure 600 to either side may be applied to the flexible graphite structure 600.

When the force of pulling the flexible graphite structure 600 to either side is applied to the flexible graphite structure 600, the stretchable sheet layers 630*a* and 630*b* are stretched along the direction of the force, and since the graphite sheet unit 650 is integrally bonded to the stretchable sheet layers 630*a* and 630*b* and the graphite sheet layer 610*a* of the flexible graphite structure 600 includes the overlapping area OL formed by two foldable portions 640, as the foldable portions 640 of the graphite sheet layer 610*a* are unfolded in response to the application of the force, and the graphite sheet layer 610*a* can also be extended to either side along the direction of the force. In addition, since the both sides of the adhesive layers 620*a* and 620*b* are fixedly attached between the graphite sheet layers 610*a*, 610*b*, and 610*c*, and the both sides of the graphite sheet layers 610*b* and 610*c* are fixedly attached between the stretchable sheet layers 630*a* and 630*b* and the adhesive layers 620*a* and 620*b*, the adhesive layers 620*a* and 620*b* and the graphite sheet layers 610*b* and 610*c* also move away from each other in response to the extension of the stretchable sheet layers 630*a* and 630*b* and the graphite sheet layer 610*a*.

As the graphite sheet unit 650 is extended to either side, the width of the overlapping area OL gradually decreases, and when the graphite sheet part 650 is maximally extended, the overlapping area OL may disappear.

When the user returns the electronic device to its original state after the operation of bending or folding the display of the electronic device is performed, the force of pulling the flexible graphite structure 600 to either side is released from the flexible graphite structure 600. When the force of pulling the flexible graphite structure 600 to either side is released, the stretchable sheet layers 630*a* and 630*b* are contracted back to their original lengths again, and accordingly, the width of the overlapping area OL of the graphite sheet unit 650 increases. As the contraction of the stretchable sheet layers 630*a* and 630*b* is terminated, the flexible graphite structure 600 returns to its original shape, that is, to the shape illustrated in FIG. 6A.

As the forces are applied to and released from the flexible graphite structure 600, the above-described operation is repeatedly performed. Through this operation, heat dissipation of the flexible electronic device can be smoothly performed even when a graphite structure with a high thermal conductivity but low flexibility is used as a heat dissipation sheet. In the flexible graphite structure 600 according to the present embodiment, since it is possible to make the thickness of the graphite sheet unit 650 substantially uniform in the state before extension by using the adhesive layers 620*a* and 620*b* and the graphite sheet layers 610*b* and 610*c*, it is possible to attach the graphite structure to a flexible electronic device more easily.

Figure 7A:
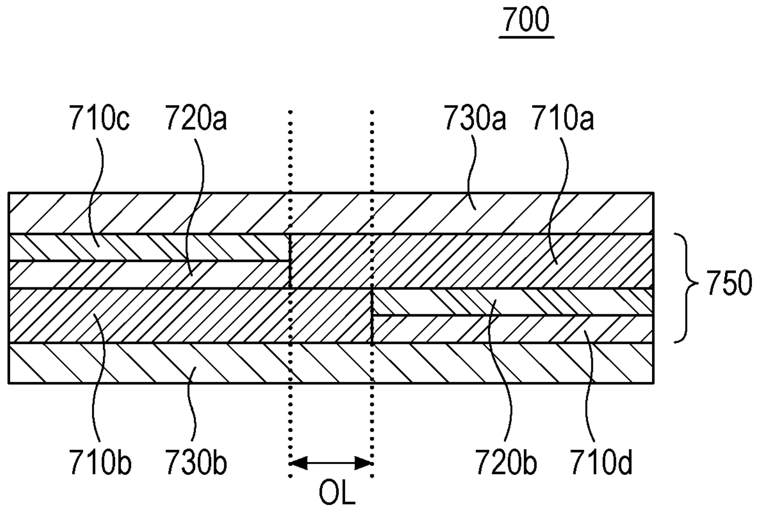

FIG. 7A is a cross-sectional view of a flexible graphite structure 700 according to an embodiment of the present disclosure in which an overlapping area is formed as a stretchable area.

Referring to FIG. 7A, the flexible graphite structure 700 includes: a graphite sheet unit 750 including four graphite sheet layers 710*a*, 710*b*, 710*c*, and 710*d* and adhesive layers 720*a* and 720*b* formed on the graphite sheet layer 710*a*, 710*b*, 710*c*, and 710*d*; and stretchable sheet layers 730*a* and 730*b* attached to the outermost both surfaces of the graphite sheet unit 750.

The graphite sheet layers 710*a*, 710*b*, 710*c*, and 710*d*, the adhesive layers 720*a* and 720*b*, and the stretchable sheet layers 730*a* and 730*b* may be formed of the same materials as the aforementioned graphite sheet layers, adhesive layers, and stretchable sheet layers, respectively, and overlapping descriptions will be omitted.

The graphite sheet unit 750 includes an overlapping area OL formed by overlapping the two graphite sheet layers 710*a* and 710*b*. The overlapping area OL refers to an area in which the two graphite sheet layers 710*a* and 710*b* overlap each other when viewed in the vertical direction of FIG. 7A, that is, in the depth direction of the flexible graphite structure 700.

The adhesive layers 720*a* and 720*b* may be formed on portions where the overlapping area OL is not formed in the graphite sheet layers 710*a*, 710*b*, 710*c*, and 710*d*, wherein the adhesive layer 720*a* may be formed between the graphite sheet layer 710*b* and the graphite sheet layer 710*c*, and the adhesive layer 720*b* may be formed between the graphite sheet layer 710*a* and the graphite sheet layer 710*d*. It is possible to make the thickness of the graphite sheet unit 750 uniform by using the adhesive layers 720*a* and 720*b* and the graphite sheet layers 710*c* and 710*d*.

There is no particular limitation on the type or shape of the adhesive layers 720*a* and 720*b* formed between the graphite sheet layers 710*a*, 710*b*, 710*c*, and 710*d* that are spaced apart from each other. However, when the adhesive layers 720*a* and 720*b* are, for example, in the form of an adhesive film, the adhesive layers are preferably double-sided adhesive films since adhesion layers are required on the both sides thereof that face the graphite sheet layers 710*a*, 710*b*, 710*c*, and 710*d* in order to be bonded to the graphite sheet layers 710*a*, 710*b*, 710*c*, and 710*d*.

In the overlapping area OL, the end portions of the two graphite sheet layers 710*a* and 710*b* are not bonded to the adhesive layers 720*a* and 720*b* and the graphite sheet layers 710*c* and 710*d*, and void spaces may be defined. That is, the overlapping area OL may include void spaces on the opposite sides thereof, and the void spaces may extend in a direction perpendicular to the stretchable direction of the flexible graphite structure 700. Due to the existence of the void spaces, when a force is applied to the flexible graphite structure 700, the flexible graphite structure 100 may be extended along the direction of the force.

Figure 7B:
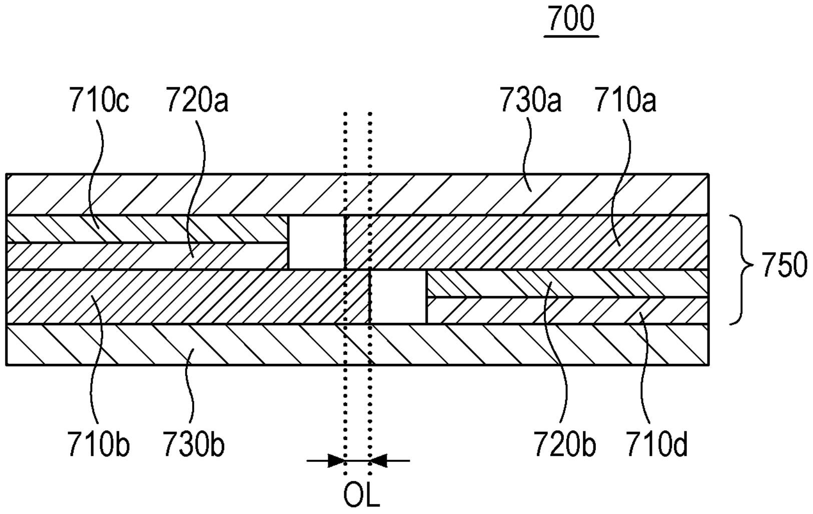

FIG. 7B is a cross-sectional view of the flexible graphite structure 700 when the flexible graphite structure 700 is extended in the stretchable direction.

Referring to FIG. 7B, when a user manipulates the electronic device such that the display of the electronic device is bent or folded, a force of pulling the flexible graphite structure 700 to either side may be applied to the flexible graphite structure 700.

When a force of pulling the flexible graphite structure 700 to either side is applied to the flexible graphite structure 700, the stretchable sheet layers 730*a* and 730*b* are extended along the directions of the forces, and since the graphite sheet unit 750 is integrally bonded to the stretchable sheet layers 730*a* and 730*b*, the graphite sheet layer 710*a* of the graphite sheet unit 750 moves in one direction, and the graphite sheet layer 710*b* moves in the opposite direction to the one direction. In addition, since the both sides of the adhesive layers 720*a* and 720*b* are fixedly attached between the graphite sheet layers 710*a*, 710*b*, 710*c*, and 710*d*, and the both sides of the graphite sheet layers 710*c* and 710*d* are fixedly attached between the stretchable sheet layers 730*a* and 730*b* and the adhesive layers 720*a* and 720*b*, the adhesive layers 720*a* and 720*b* and the graphite sheet layers 710*c* and 710*d* also move away from each other in response to the extension of the stretchable sheet layers 730*a* and 730*b* and the graphite sheet layer 710*a* and 710*b*. In particular, since the two graphite sheet layers 710*a* and 710*b* are not bonded to each other, but are stacked on each other, the graphite sheet layers can slide and move in the opposite directions by the application of the forces. As the two graphite sheet layers 710*a* and 710*b* move in the opposite directions, the graphite sheet unit 750 is also extended to either side.

As the graphite sheet unit 750 is extended to either side, the width of the overlapping area OL gradually decreases, and until the overlapping area OL by the two graphite sheet layers 710*a* and 710*b* completely disappears, the flexible graphite structure 700 can be extended.

When the user returns the electronic device to its original state after the operation of bending or folding the display of the electronic device is performed, the force of pulling the flexible graphite structure 700 to either side is released from the flexible graphite structure 700. When the force of pulling the flexible graphite structure 700 to either side is released, the stretchable sheet layers 730*a* and 730*b* are contracted back to their original lengths again, and accordingly, the width of the overlapping area OL of the graphite sheet unit 750 increases. As the contraction of the stretchable sheet layers 730*a* and 730*b* is terminated, the flexible graphite structure 700 returns to its original shape, that is, to the shape illustrated in FIG. 7A.

As the forces are applied to and released from the flexible graphite structure 700, the above-described operation is repeatedly performed. Through this operation, heat dissipation of the flexible electronic device can be smoothly performed even when a graphite structure with a high thermal conductivity but low flexibility is used as a heat dissipation sheet. In the flexible graphite structure 700 according to the present embodiment, since it is possible to make the thickness of the graphite sheet unit 750 substantially uniform in the state before extension by using the adhesive layers 720*a* and 720*b*, and the graphite sheet layers 710*c* and 710*d*, it is possible to attach the graphite structure to a flexible electronic device more easily.

Figure 8A:
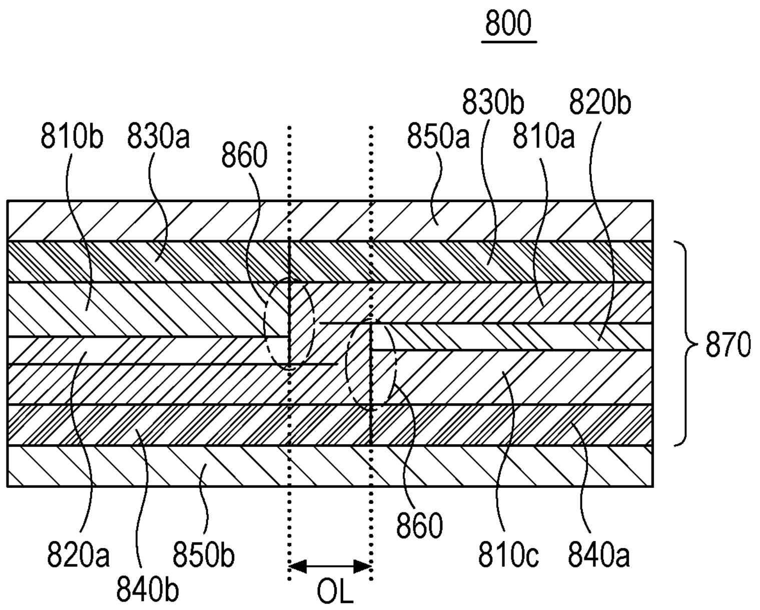

FIG. 8A is a cross-sectional view of a flexible graphite structure 800 according to an embodiment of the present disclosure in which an overlapping area is formed as a stretchable area.

Referring to FIG. 8A, the flexible graphite structure 800 includes: a graphite sheet unit 870 including three graphite sheet layers 810*a*, 810*b*, and 810*c* and adhesive layers 820*a*, 820*b*, 830*a*, 830*b*, 840*a*, and 840*b* formed on the graphite sheet layer 810*a*, 810*b*, and 810*c*; and stretchable sheet layers 850*a* and 850*b* attached to the outermost both sides of the graphite sheet unit 870.

The graphite sheet layers 810*a*, 810*b*, and 810*c*, the adhesive layers 820*a*, 820*b*, 830*a*, 830*b*, 840*a*, and 840*b*, and the stretchable sheet layers 850*a* and 850*b* may be formed of the same materials as the aforementioned graphite sheet layers, adhesive layers, and stretchable sheet layers, respectively, and overlapping descriptions will be omitted.

The graphite sheet layer 810*a* includes at least two foldable portions 860 formed by folding the graphite sheet layer 810*a*, and, between the two foldable portions 860, an overlapping area OL is formed by the two foldable portions 860. The overlapping area OL refers to an area where portions of the graphite sheet layer 810*a* overlap each other when viewed in the vertical direction of FIG. 8A, that is, in the depth direction of the flexible graphite structure 800.

The adhesive layers 820*a* and 820*b* may be formed on portions where the overlapping area OL is not formed in the graphite sheet layers 810*a*, 810*b*, and 810*c*, wherein the adhesive layer 820*a* may be formed between the graphite sheet layer 810*a* and the graphite sheet layer 810*b*, and the adhesive layer 820*b* may be formed between the graphite sheet layer 810*a* and the graphite sheet layer 810*c*. The adhesive layers 830*a* and 830*b* may be formed between the graphite sheet layers 810*a* and 810*b* and the stretchable sheet layer 850*a*, and the adhesive layers 840*a* and 840*b* may be formed between the graphite sheet layers 810*a* and 810*c* and the stretchable sheet layer 850*b*. In addition, the adhesive layers 830*a*, 830*b*, 840*a*, and 840*b* formed between the graphite sheet layers 810*a*, 810*b*, and 810*c* and the stretchable sheet layers 850*a* and 850*b* may be segmented along the foldable portions 860 of the graphite sheet layer 810*a*. It is possible to make the thickness of the graphite sheet unit 850 substantially uniform by using the adhesive layers 820*a*, 820*b*, 830*a*, 830*b*, 840*a*, and 840*b* and the graphite sheet layers 810*b* and 810*c*.

There is no particular limitation on the type or shape of the adhesive layers 820*a* and 820*b* formed between the graphite sheet layers 810*a*, 810*b*, and 810*c* that are spaced apart from each other. However, when the adhesive layers

820*a* and 820*b* are, for example, in the form of an adhesive film, the adhesive layers are preferably double-sided adhesive films since adhesion layers are required on the both sides thereof that face the graphite sheet layers 810*a*, 810*b*, and 810*c* in order to be bonded to the graphite sheet layers 810*a*, 810*b*, and 810*c*.

When the adhesive layers 830*a*, 830*b*, 840*a*, and 840*b* formed between the graphite sheet layers 810*a*, 810*b*, and 810*c* and the stretchable sheet layers 850*a* and 850*b* are, for example, in the form of an adhesive film, each of the adhesive layers may not only be a double-sided adhesive film, but also a single-sided adhesive film since it is sufficient if an adhesion layer can be disposed on a surface that faces the graphite sheet layer 810*a*, 810*b*, or 810*c*.

The foldable portions 860 of the graphite sheet layer 810*a*, the adhesive layers 820*a* and 820*b*, and the graphite sheet layers 810*b* and 810*c* are not bonded to each other, and the adhesive layers 830*a*, 830*b*, 840*a*, and 840*b* are segmented along the foldable portions 860, void spaces may be defined therebetween. Accordingly, the overlapping area OL may include void spaces on the opposite sides thereof, and the void spaces may extend in a direction perpendicular to the stretchable direction of the flexible graphite structure 800. Due to the existence of the void spaces, when a force is applied to the flexible graphite structure 800, the flexible graphite structure 800 may be extended along the direction of the force.

Figure 8B:
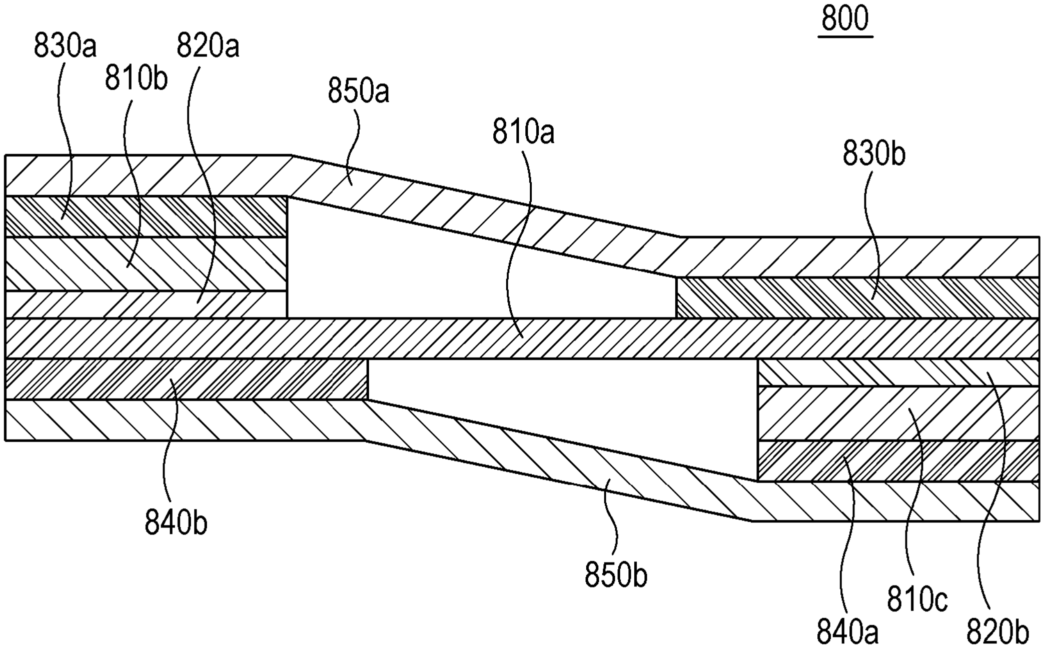

FIG. 8B is a cross-sectional view of the flexible graphite structure 800 when the flexible graphite structure 800 is extended in the stretchable direction.

Referring to FIG. 8B, when a user manipulates the electronic device such that the display of the electronic device is bent or folded, a force of pulling the flexible graphite structure 800 to either side may be applied to the flexible graphite structure 800.

When the force of pulling the flexible graphite structure 800 to either side is applied to the flexible graphite structure 800, the stretchable sheet layers 850*a* and 850*b* are stretched along the direction of the force, and since the graphite sheet unit 870 is integrally bonded to the stretchable sheet layers 850*a* and 850*b* and the graphite sheet layer 810*a* of the flexible graphite structure 800 includes the overlapping area OL formed by two foldable portions 860, the foldable portions 860 of the graphite sheet layer 810*a* are unfolded in response to the application of the forces, and the graphite sheet layer 810*a* can also be extended to either side along the direction of the force. In addition, since the adhesive layers 820*a*, 820*b*, 830*a*, 830*b*, 840*a*, and 840*b* and the graphite sheet layers 810*b* and 810*c* are fixedly stacked between the graphite sheet layer 810*a* and the stretchable sheet layers 850*a* and 850*b*, the adhesive layers 820*a*, 830*a*, and 840*b* and the graphite sheet layer 810*b* move away from the adhesive layers 820*b*, 830*b*, and 840*a* and the graphite sheet layer 810*c* in response to the extension of the stretchable sheet layers 850*a* and 850*b* and the graphite sheet layer 810*a*.

When the stretchable sheet layers 850*a* and 850*b* are elongated, the stretchable sheet layers 850*a* and 850*b* corresponding to the segmented portion between the adhesive layers 830*a* and 830*b* and the segmented portion between the adhesive layers 840*a* and 840*b* may be elongated from greater than 0 to 50% or less or from greater than 0 to 30% or less.

As the graphite sheet unit 870 is extended to either side, the width of the overlapping area OL gradually decreases, and when the graphite sheet part 870 is maximally extended, the overlapping area OL may disappear.

When the user returns the electronic device to its original state after the operation of bending or folding the display of the electronic device is performed, the force of pulling the flexible graphite structure 800 to either side is released from the flexible graphite structure 800. When the force of pulling the flexible graphite structure 800 to either side is released, the stretchable sheet layers 850*a* and 850*b* are contracted back to their original lengths again, and accordingly, the width of the overlapping area OL of the graphite sheet unit 870 increases. As the contraction of the stretchable sheet layers 850*a* and 850*b* is terminated, the flexible graphite structure 800 returns to its original shape, that is, to the shape illustrated in FIG. 8A.

Figure 9A:
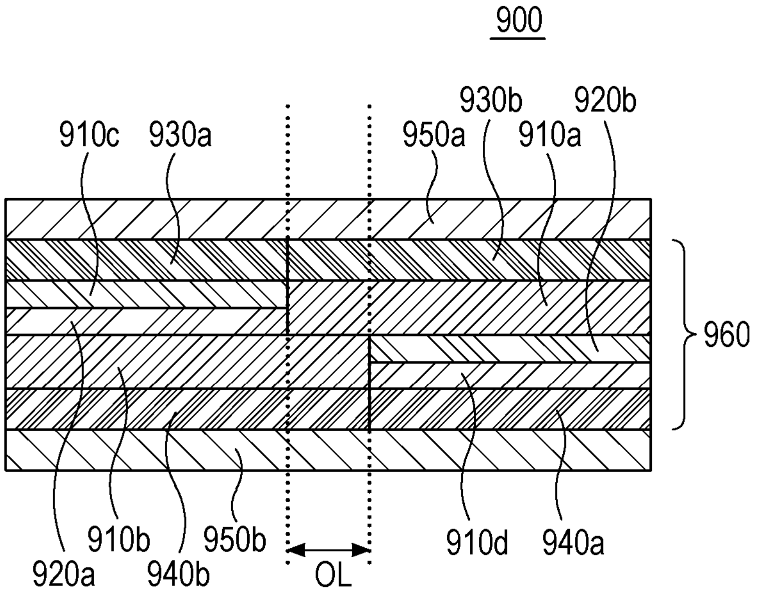

FIG. 9A is a cross-sectional view of a flexible graphite structure 900 according to an embodiment of the present disclosure in which an overlapping area is formed as a stretchable area.

Referring to FIG. 9A, the flexible graphite structure 900 includes: a graphite sheet unit 960 including four graphite sheet layers 910*a*, 910*b*, 910*c*, and 910*d* and adhesive layers 920*a*, 920*b*, 930*a*, 930*b*, 940*a*, and 940*b* formed on the graphite sheet layer 910*a*, 910*b*, 910*c*, and 910*d*; and stretchable sheet layers 950*a* and 950*b* attached to the outermost both sides of the graphite sheet unit 960.

The graphite sheet layers 910*a*, 910*b*, 910*c*, and 910*d*, the adhesive layers 920*a*, 920*b*, 930*a*, 930*b*, 940*a*, and 940*b*, and the stretchable sheet layers 950*a* and 950*b* may be formed of the same materials as the aforementioned graphite sheet layers, adhesive layers, and stretchable sheet layers, respectively, and overlapping descriptions will be omitted.

The graphite sheet unit 960 includes an overlapping area OL formed by overlapping the two graphite sheet layers 910*a* and 910*b*. The overlapping area OL refers to an area in which the two graphite sheet layers 910*a* and 910*b* overlap each other when viewed in the vertical direction of FIG. 9A, that is, in the depth direction of the flexible graphite structure 900.

The adhesive layers 920*a* and 920*b* may be formed on portions where the overlapping area OL is not formed in the graphite sheet layers 910*a*, 910*b*, 910*c*, and 910*d*, wherein the adhesive layer 920*a* may be formed between the graphite sheet layer 910*b* and the graphite sheet layer 910*c*, and the adhesive layer 920*b* may be formed between the graphite sheet layer 910*a* and the graphite sheet layer 910*d*. The adhesive layers 930*a* and 930*b* may be formed between the graphite sheet layers 910*a* and 910*c* and the stretchable sheet layer 950*a*, and the adhesive layers 940*a* and 940*b* may be formed between the graphite sheet layers 910*b* and 910*d* and the stretchable sheet layer 950*b*. In addition, the adhesive layers 930*a*, 930*b*, 940*a*, and 940*b* formed between the graphite sheet layers 910*a*, 910*b*, 910*c*, and 910*d* and the stretchable sheet layers 950*a* and 950*b* may be segmented along the end portions of the graphite sheet layers 910*a* and 910*b* in the overlapping area OL. It is possible to make the thickness of the graphite sheet unit 960 substantially uniform by using the adhesive layers 920*a*, 920*b*, 930*a*, 930*b*, 940*a*, and 940*b* and the graphite sheet layers 910*c* and 910*d*.

There is no particular limitation on the type or shape of the adhesive layers 920*a* and 920*b* formed between the graphite sheet layers 910*a*, 910*b*, 910*c*, and 910*d* that are spaced apart from each other. However, when the adhesive layers 920*a* and 920*b* are, for example, in the form of an adhesive film, the adhesive layers are preferably double-sided adhesive films since adhesion layers are required on the both sides thereof that face the graphite sheet layers 910*a*, 910*b*, 910*c*, and 910*d* in order to be bonded to the graphite sheet layers 910*a*, 910*b*, 910*c*, and 910*d*.

When the adhesive layers 930*a*, 930*b*, 940*a*, and 940*b* formed between the graphite sheet layers 910*a*, 910*b*, 910*c*, and 910*d* and the stretchable sheet layers 950*a* and 950*b* are, for example, in the form of an adhesive film, each of the adhesive layers may be not only a double-sided adhesive film, but also a single-sided adhesive film since it is sufficient if an adhesion layer can be disposed on a surface that faces the graphite sheet layer 910*a*, 910*b*, 910*c*, or 910*d*.

In the overlapping area OL, the end portions of the two graphite sheet layers 910*a* and 910*b* are not bonded to the adhesive layers 920*a* and 920*b* and the graphite sheet layers 910*c* and 910*d*, and the adhesive layers 930*a*, 930*b*, 940*a*, and 940*b* are segmented along the end portions of the graphite sheet layers 910*a* and 910*b* in the overlapping area OL, so void spaces may be defined therebetween. Accordingly, the overlapping area OL may include void spaces on the opposite sides thereof, and the void spaces may extend in a direction perpendicular to the stretchable direction of the flexible graphite structure 900. Due to the existence of the void spaces, when a force is applied to the flexible graphite structure 900, the flexible graphite structure 900 may be extended along the direction of the force.

Figure 9B:
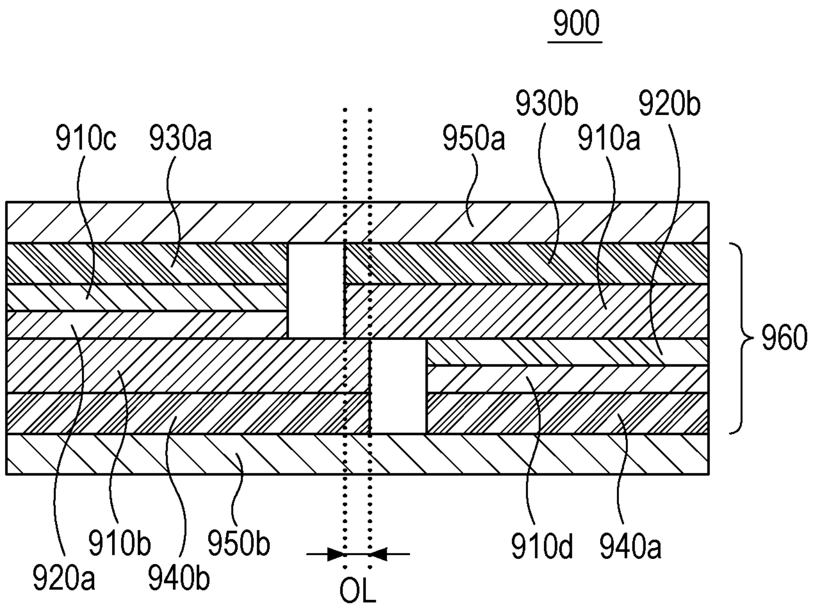

FIG. 9B is a cross-sectional view of the flexible graphite structure 900 when the flexible graphite structure 900 is extended in the stretchable direction.

Referring to FIG. 9B, when a user manipulates the electronic device such that the display of the electronic device is bent or folded, a force of pulling the flexible graphite structure 900 to either side may be applied to the flexible graphite structure 900.

When the force of pulling the flexible graphite structure 900 to either side is applied to the flexible graphite structure 900, the stretchable sheet layers 950*a* and 950*b* are extended along the directions of the forces, and since the graphite sheet unit 960 is integrally bonded to the stretchable sheet layers 950*a* and 950*b*, the graphite sheet layer 910*a* of the graphite sheet unit 960 moves in one direction, and the graphite sheet layer 910*b* moves in the opposite direction to the one direction. In addition, since the adhesive layers 920*a*, 920*b*, 930*a*, 930*b*, 940*a*, and 940*b* and the graphite sheet layers 910*c* and 910*d* are fixedly stacked between the graphite sheet layers 910*a* and 910*b* and the stretchable sheet layers 950*a* and 950*b*, the adhesive layers 920*a*, 930*a*, and 940*b* and the graphite sheet layer 910*c* move away from the adhesive layers 920*b*, 930*b*, and 940*a* and the graphite sheet layer 910*d* in response to the extension of the stretchable sheet layers 950*a* and 950*b* and the graphite sheet layer 910*a* and 910*b*. In particular, since the two graphite sheet layers 910*a* and 910*b* are not bonded to each other, but are stacked on each other, the graphite sheet layers can slide and move in the opposite directions by the application of the forces. As the two graphite sheet layers 910*a* and 910*b* move in the opposite directions, the graphite sheet unit 960 is also extended to either side.

As the graphite sheet unit 960 is extended to either side, the width of the overlapping area OL gradually decreases, and until the overlapping area OL by the two graphite sheet layers 910*a* and 910*b* completely disappears, the flexible graphite structure 900 can be extended.

When the user returns the electronic device to its original state after the operation of bending or folding the display of the electronic device is performed, the force of pulling the flexible graphite structure 900 to either side is released from the flexible graphite structure 900. When the force of pulling the flexible graphite structure 900 to either side is released, the stretchable sheet layers 950*a* and 950*b* are contracted back to their original lengths again, and accordingly, the width of the overlapping area OL of the graphite sheet unit 960 increases. As the contraction of the stretchable sheet layers 950*a* and 950*b* is terminated, the flexible graphite structure 900 returns to its original shape, that is, to the shape illustrated in FIG. 9A.

Figure 10A:
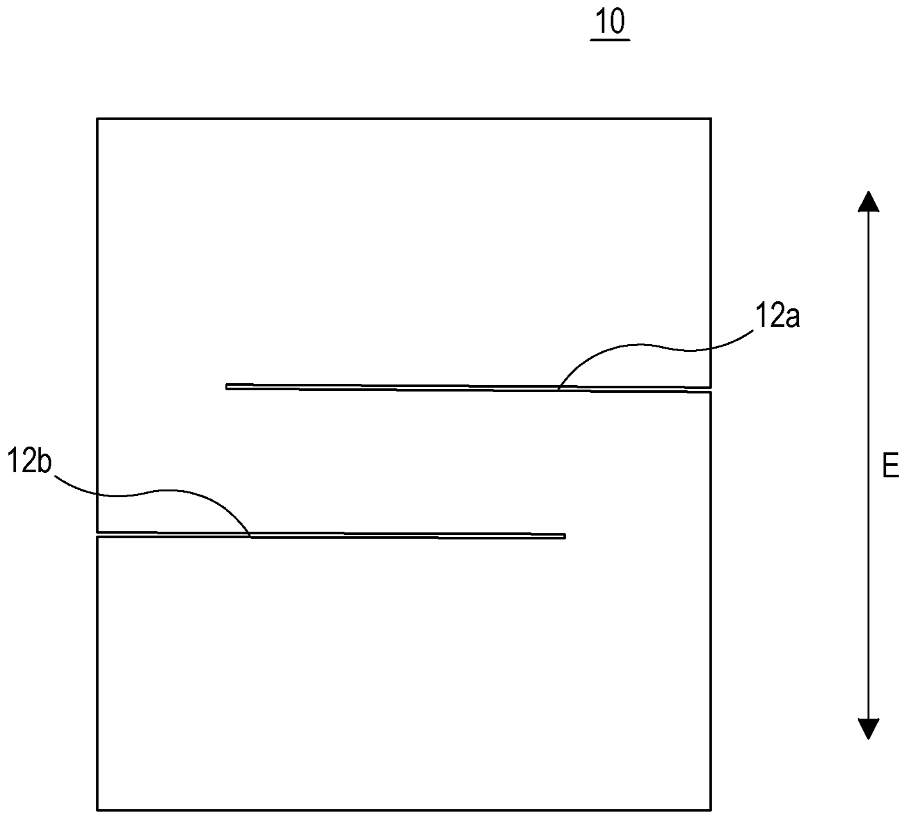
FIGS. 10A and 11A are plan views of graphite sheet layers according to various embodiments in which cutout areas are formed as a stretchable area.

FIG. 10A is a plan view of a graphite sheet layer 10 that is applicable to a flexible graphite structure according to an embodiment of the present disclosure in which cutout areas are formed as a stretchable area.

Referring to FIG. 10A, the graphite sheet layer 10 includes two cutout areas 12*a* and 12*b*, and the two cutout areas 12*a* and 12*b* are provided in a symmetric manner in the graphite sheet layer 10. The graphite sheet layer 10 may be formed of the same material as the above-described graphite sheet layers, and overlapping descriptions will be omitted.

The length of the two cutout areas 12*a* and 12*b* in a direction perpendicular to the stretchable direction E of the graphite sheet layer 10 may be shorter than the length of the graphite sheet layer 10 in the perpendicular direction, the cutout area 12*a* cuts one end portion of the graphite sheet layer 10, and the cutout area 12*b* cuts the other end portion of the graphite sheet layer 10. In addition, the length of the two cutout areas 12*a* and 12*b* in the direction perpendicular to the stretchable direction E is 90% or less, or 75% or less of the length of the graphite sheet layer 10 in the perpendicular direction.

Since the length in the direction perpendicular to the stretchable direction E of the cutout areas 12*a* and 12*b* is shorter than the length of the graphite sheet layer 10 in the perpendicular direction, the graphite sheet layer 10 is connected in one sheet in the other areas than the cutout areas 12*a* and 12*b*.

In the graphite sheet layer 10, void spaces are defined by the cutout areas 12*a* and 12*b*, and the void spaces extend in a direction perpendicular to the stretchable direction E.

Figure 10B:
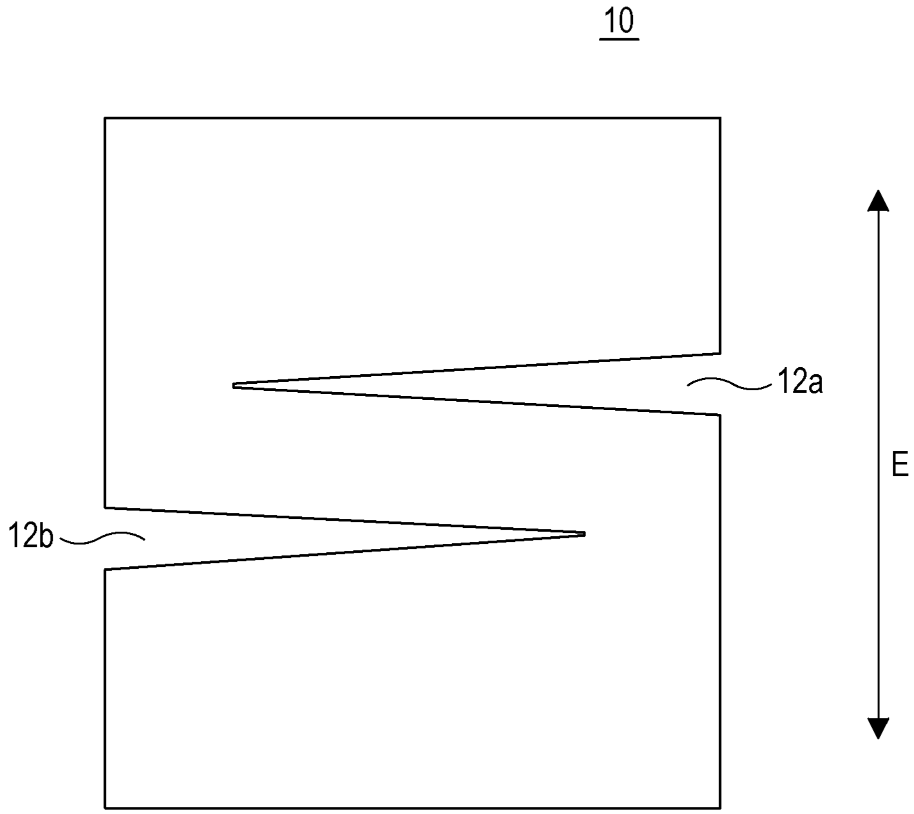
FIGS. 10B and 11B are respective cross-sectional views of the graphite sheet layers of FIGS. 10A and 11A when the graphite sheet layers are extended in a stretchable direction.

FIG. 10B is a plan view of the graphite sheet layer 10 when the flexible graphite structure in which stretchable sheet layers (not illustrated) formed on the both sides of the graphite sheet layer 10 are extended in the stretchable direction E.

Referring to FIG. 10B, a flexible graphite structure including the graphite sheet layer 10 may be used as a heat dissipation sheet in an electronic device equipped with a flexible display which is bendable or a foldable display which folds and unfolds. When a user manipulates the electronic device such that the display of the electronic device is bent or folded, a force of pulling the graphite sheet layer 10 of the flexible graphite structure to either side may be applied to in the graphite sheet layer 10.

When a pulling force is applied to the graphite sheet layer 10 in the stretchable direction E, the stretchable sheet layers formed on the both sides of the graphite sheet layer 10 are stretched along the direction of the force. Since the graphite sheet layer 10 is integrally bonded to the stretchable sheet layers, the graphite sheet layer 10 is also extended in the stretchable direction E along the direction of the force.

Since the graphite sheet layer 10 does not have stretchability, if the graphite sheet layer is a flat graphite sheet, it will be torn without being extended even if a force is applied thereto. However, since the graphite sheet layer 10 includes the cutout areas 12*a* and 12*b*, the graphite sheet layer 10 can also be extended in the stretchable direction E along the direction of the force in response to the application of the force.

When the user returns the electronic device to its original state after the operation of bending or folding the display of the electronic device is performed, a pulling force in the stretchable direction E is released from the graphite sheet layer 10 of the flexible graphite structure. When the force of pulling the graphite sheet layer 10 in the stretchable direction E is released, the stretchable sheet layers are contracted back to the original length thereof, and accordingly the cutout areas 12*a* and 12*b* of the graphite sheet layer 10 are also reduced. As the contraction of the stretchable sheet layers is terminated, the graphite sheet layer 10 returns to its original shape, that is, the shape illustrated in FIG. 10A.

Figure 11A:
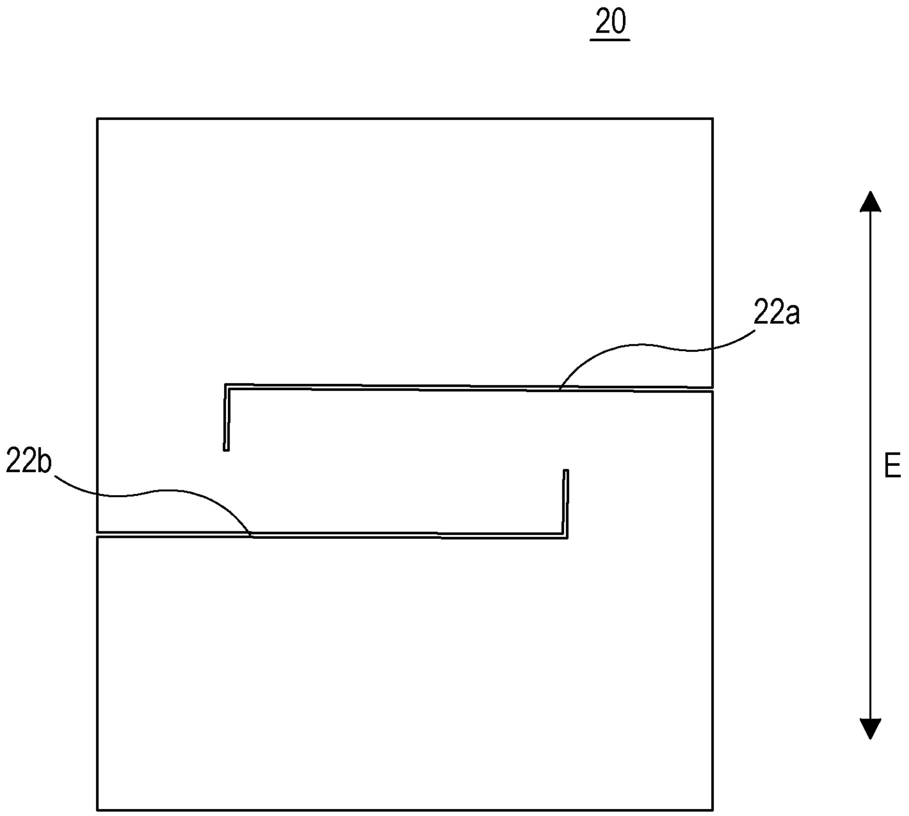
Figure 11B:
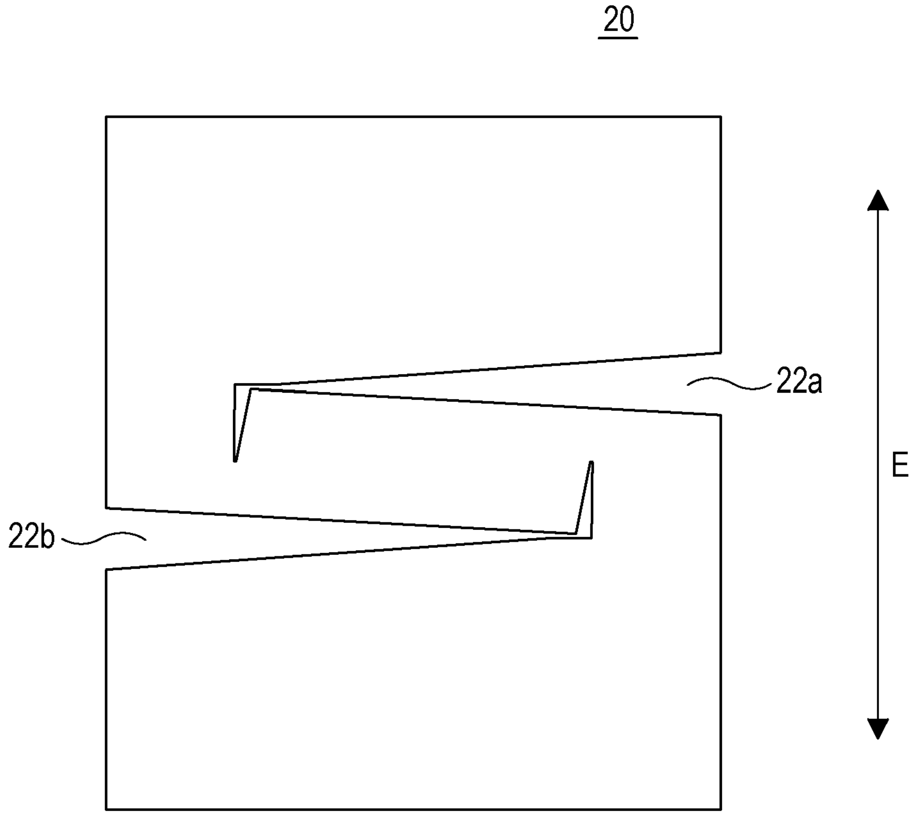

FIG. 11A is a plan view of a graphite sheet layer 20 that is applicable to a flexible graphite structure according to an embodiment of the present disclosure in which cutout areas are formed as a stretchable area. FIG. 11B is a plan view of the graphite sheet layer 20 when the flexible graphite structure in which stretchable sheet layers (not illustrated) formed on the both sides of the graphite sheet layer 20 are extended in the stretchable direction E.

Referring to FIGS. 11A and 11B, the graphite sheet layer 20 includes two cutout areas 22*a* and 22*b*, and the cutout areas 22*a* and 22*b* may each have a shape in which one end thereof is bent in the stretchable direction E. Since the features of the graphite sheet layer 20 and the two cutout areas 22*a* and 22*b* are the same as those of the above-mentioned graphite sheet layer 10 and two cutout areas 12*a* and 12*b*, a description thereof will be omitted.

Figure 12A:
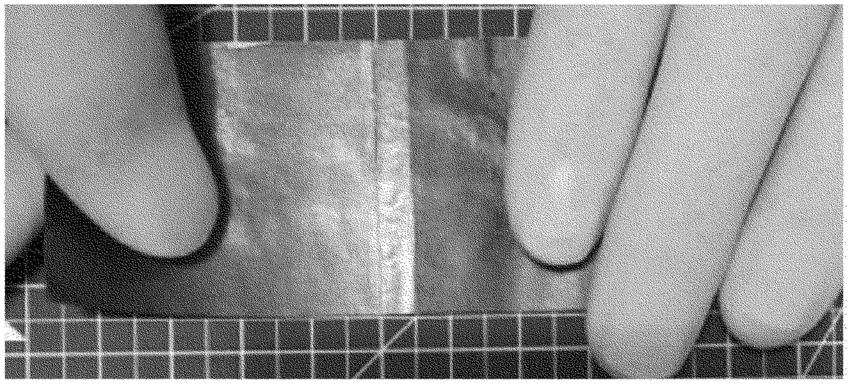
FIG. 12A is an actual photograph of a flexible graphite structure according to an embodiment in which an overlapping area is formed as a stretchable area.

FIG. 12A is an actual photograph of a flexible graphite structure according to an embodiment in which an overlapping area is provided as a stretchable area, in the state in which an overlapping area is formed, that is, the state before a force of pulling the flexible graphite structure to either side is applied to the flexible graphite structure.

Figure 12B:
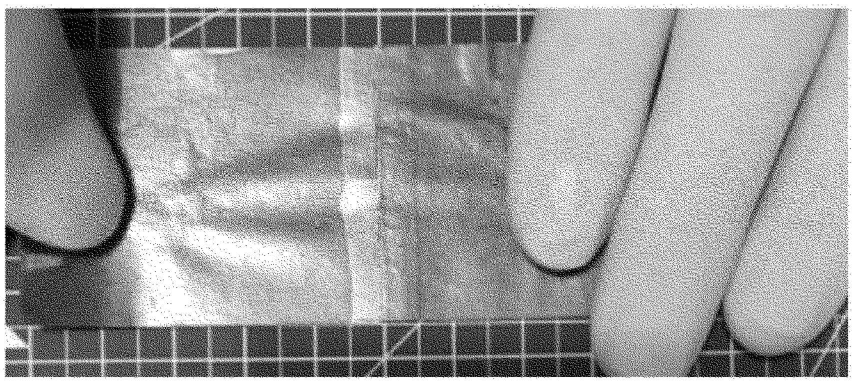
FIG. 12B is an actual photograph of the flexible graphite structure of FIG. 12A when the flexible graphite is extended in a stretchable direction.

FIG. 12B is an actual photograph when the flexible graphite structure of FIG. 12A is extended in the stretchable direction. When a force of pulling the flexible graphite structure of FIG. 12A to either side is applied to the flexible graphite structure, the width of the overlapping area is gradually reduced while the stretchable sheet layers and the graphite sheet layer of the flexible graphite structure are extended to either side along the direction of the force. When the graphite sheet layer is maximally extended, the overlapping area may disappear, and a shape illustrated in FIG. 12B may be exhibited.

When the force of pulling the flexible graphite structure of FIG. 12B to either side is released, the stretchable sheet layer is contracted back to its original length, and thus the overlapping area is formed again so that the flexible graphite structure may return to the shape of FIG. 12A.

Figure 13A:
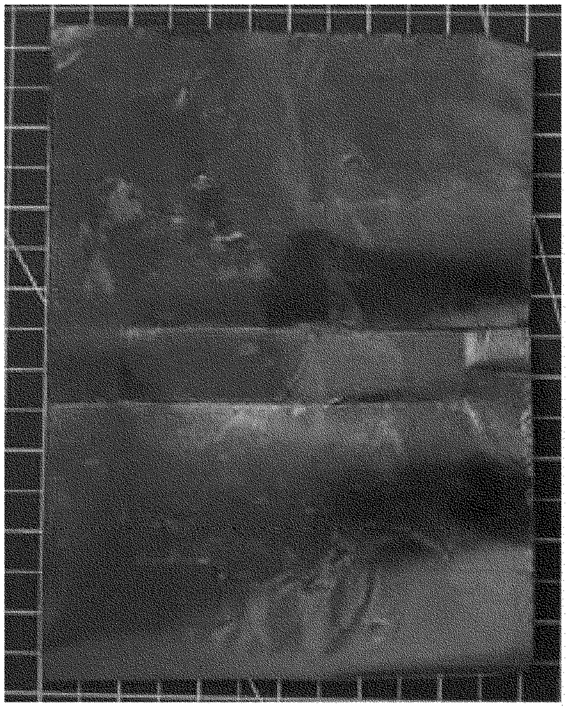
FIG. 13A is an actual photograph of a flexible graphite structure according to an embodiment in which cutout areas are formed as a stretchable area.

FIG. 13A is an actual photograph of a flexible graphite structure according to an embodiment in which cutout areas are formed as a stretch area. Two cutout areas are formed in the flexible graphite structure in a direction perpendicular to the stretchable direction. Since the lengths of the two cutout areas are shorter than the lengths of the graphite sheet layers in a direction parallel thereto, the graphite sheet layers are connected in one sheet other than the two cut areas.

Figure 13B:
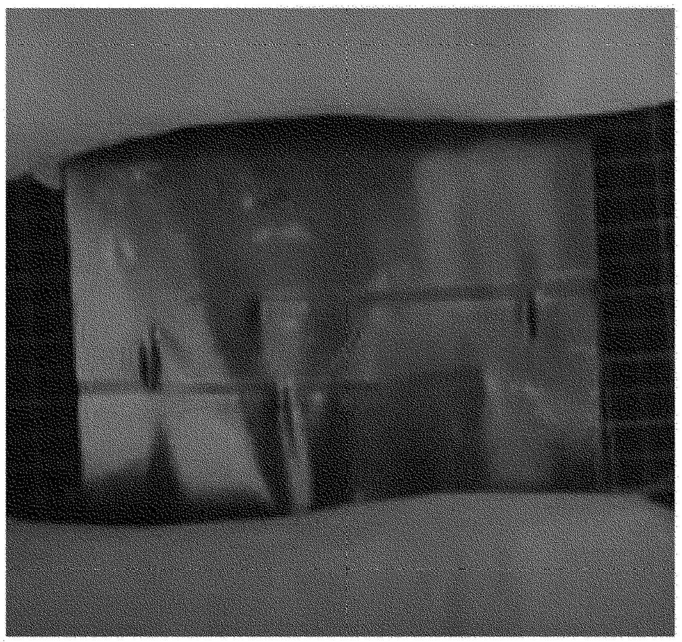
FIG. 13B is an actual photograph of the flexible graphite structure of FIG. 13A when the flexible graphite is extended in a stretchable direction.

FIG. 13B is an actual photograph when the flexible graphite structure of FIG. 13A is extended in the stretchable direction. When a force of pulling the flexible graphite structure of FIG. 13A to either side is applied, the cutout areas of the graphite sheet layer can be widened and the graphite sheet layer can also be extended along the direction of the force.

When the force of pulling the flexible graphite structure of FIG. 13B to either side is released, the stretchable sheet layer is contracted back to its original length, and accordingly, the cutout areas of the graphite sheet layer are also reduced. As the contraction of the stretchable sheet layer is terminated, the flexible graphite structure may return to its original shape, that is, the shape illustrated in FIG. 13A.

As the force is applied to and released from the graphite sheet layers 10 and 20 of the flexible graphite structure, the above-described operation is repeatedly performed. Through this operation, heat dissipation of the flexible electronic device can be smoothly performed even when a graphite structure with a high thermal conductivity but low flexibility is used as a heat dissipation sheet.

In the above, flexible graphite structures have been described with reference to the embodiments illustrated in the drawings, but these are only exemplary. A person of ordinarily skill in the art will understand that various modifications and equivalent other embodiments are possible therefrom. It should be understood that while the embodiments illustrated in the drawings include up to four graphite sheets layers in the graphite structures, the graphite structures of the present disclosure include a single graphite sheet layer or multiple graphite sheet layers, including but not limited to at least two graphite sheet layers, at least three graphite sheet layers, at least four graphite sheet layers, at least five graphite sheet layers, etc. Therefore, the embodiments disclosed herein should be considered from a descriptive viewpoint, rather than from a restrictive viewpoint. The scope of the present disclosure is represented in the following claims rather than in the foregoing description, and all differences within the scope equivalent thereto should be construed as being included in the scope of the present disclosure.

According to the disclosed flexible graphite structure, by making the graphite sheet unit include at least one stretchable area formed by providing a cutout area or an overlapping area, the graphite structure can be used as a heat dissipation sheet in a flexible electronic device to ensure an excellent heat dissipation property.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

EXPLANATION OF REFERENCE NUMERALS

100, 200, 300, 400, 500, 600, 700, 800, 900: flexible graphite structure; 10, 20, 110, 210*a*, 210*b*, 310, 410*a*, 410*b*, 410*c*, 510*a*, 510*b*, 610*a*, 610*b*, 610*c*, 710*a*, 710*b*, 710*c*, 710*d*, 810*a*, 810*b*, 810*c*, 910*a*, 910*b*, 910*c*, 910*d*: graphite sheet layer; 120*a*, 120*b*, 220*a*, 220*b*, 330*a*, 330*b*, 430*a*, 430*b*, 530*a*, 530*b*, 630*a*, 630*b*, 730*a*, 730*b*, 850*a*, 850*b*, 950*a*, 950*b*: stretchable sheet layer; 320*a*, 320*b*, 420*a*, 420*b*, 420*c*, 520*a*, 520*b*, 620*a*, 620*b*, 720*a*, 720*b*, 820*a*, 820*b*, 830*a*, 830*b*, 840*a*, 840*b*, 920*a*, 920*b*, 930*a*, 930*b*, 940*a*, 940*b*: adhesive layer; 215, 350, 450, 550, 650, 750, 870, 960: graphite sheet unit; 130, 340, 640, 860: foldable portion; 12*a*, 12*b*, 22*a*, 22*b*: cutout area, OL: overlapping area

What is claimed is:

1. A flexible graphite structure comprising:

a graphite sheet unit comprising a single graphite sheet layer or multiple graphite sheet layers having at least one stretchable area; and a stretchable sheet layer configured to be attached to at least one of both outermost sides of the graphite sheet unit and to cover the at least one stretchable area, wherein the at least one stretchable area is formed by providing at least one pair of cutout areas in the single graphite sheet layer or by providing an overlapping area where the multiple graphite sheet layers overlap in a depth direction of the flexible graphite structure, wherein the overlapping area is formed by overlapping a portion of the multiple graphite sheet layers.

2. The flexible graphite structure of claim 1, wherein the overlapping portion of multiple graphite sheet layers are stacked on each other and not bonded to each other.

3. The flexible graphite structure of claim 1, wherein the at least one pair of cutout areas are provided in a point symmetric manner in the single graphite sheet layer, and the single graphite sheet layer is connected in one sheet in the other areas than the cutout area.

4. The flexible graphite structure of claim 3, wherein the at least one pair of cutout areas have a smaller length than the graphite sheet layer in a direction perpendicular to a stretchable direction of the flexible graphite structure.

5. The flexible graphite structure of claim 4, wherein the length of the at least one pair of cutout areas is 90% or less of the length of the graphite sheet layer in the direction perpendicular to the stretchable direction of the flexible graphite structure.

6. The flexible graphite structure of claim 3, wherein if a force is applied to the flexible graphite structure, the graphite sheet unit is extended, the stretchable sheet layer is elongated in a direction where the graphite sheet unit is extended, and the size of a void space of the at least one pair of cutout areas is increased.

7. The flexible graphite structure of claim 6, wherein if the force is released, the stretchable sheet layer is contracted and the size of the void space of the at least one pair of cutout areas is reduced.

8. The flexible graphite structure of claim 1, wherein the at least one stretchable area comprises a void space extending in the direction perpendicular to the stretchable direction of the flexible graphite structure.

9. The flexible graphite structure of claim 8, wherein the void space is defined between a graphite sheet layer provided in another area than the overlapping area and a graphite sheet layer provided in the overlapping area, or defined by the at least one pair of cutout areas.

10. The flexible graphite structure of claim 1, wherein if a force is applied to the flexible graphite structure, the graphite sheet unit is extended, the stretchable sheet layer is elongated in a direction where the graphite sheet unit is extended, and the width of the overlapping area is reduced.

11. The flexible graphite structure of claim 10, wherein if the force is released, the stretchable sheet layer is contracted and the width of the overlapping area is increased.

12. The flexible graphite structure of claim 1, wherein the graphite sheet layer comprises a graphitized polymer or compressed particles of exfoliated graphite, or a combination thereof.

13. The flexible graphite structure of claim 12, wherein the graphite sheet layer has an in-plane thermal conductivity of 150 W/mK-1700 W/mK.

14. The flexible graphite structure of claim 1, wherein the stretchable sheet layer comprises at least one selected among the group consisting of an epoxy resin, a styrene-based material, an olefin-based material, polyurethane, thermoplastic polyurethane, a thermoplastic elastomer, polyamides, synthetic rubbers, and silicones.

15. The flexible graphite structure of claim 1, wherein the stretchable sheet layer has an elongation of 175% or greater.

16. The flexible graphite structure of claim 1, wherein the stretchable sheet layer comprises a thermally conductive material.

17. The flexible graphite structure of claim 1, wherein the graphite sheet layer has a thickness of 15 μm-19 μm.

18. The flexible graphite structure of claim 1, wherein the graphite sheet unit comprises an adhesive layer provided in the graphite sheet layer, the graphite sheet unit having a uniform thickness.

19. The flexible graphite structure of claim 18, wherein the adhesive layer comprises at least one selected among the group consisting of a pressure sensitive adhesive (PSA), a thermosetting adhesive, a photo curable adhesive, an optical clear adhesive (OCA), an optical clear resin (OCR), a double-sided adhesive film, and a single-sided adhesive film.

20. The flexible graphite structure of claim 19, wherein when the adhesive layer is formed between the multiple graphite sheet layers spaced from each other, the adhesive layer is a double-sided adhesive film.

21. The flexible graphite structure of claim 19, wherein when the adhesive layer is formed between the graphite sheet layer and the stretchable sheet layer, the adhesive layer is a single-sided adhesive film.

22. The flexible graphite structure of claim 21, wherein the single-sided adhesive film is bonded to a surface facing the graphite sheet layer.

23. The flexible graphite structure of claim 1, wherein the stretchable sheet layer comprises at least one selected among the group consisting of PDMS (polydimethylsiloxane), polyolefin, polybutadiene, polyisobutylene, and polychloroprene.

* * * * *